United States Patent
Wu et al.

(10) Patent No.: US 9,568,823 B2
(45) Date of Patent: Feb. 14, 2017

(54) PHOTOSENSITIVE RESIN COMPOSITION FOR COLOR FILTER AND USES THEREOF

(71) Applicant: CHI MEI CORPORATION, Tainan (TW)

(72) Inventors: Yu-Ju Wu, Tainan (TW); Bar-Yuan Hsieh, Tainan (TW); Jung-Pin Hsu, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

(21) Appl. No.: 14/848,850

(22) Filed: Sep. 9, 2015

(65) Prior Publication Data

US 2016/0077428 A1 Mar. 17, 2016

(30) Foreign Application Priority Data

Sep. 12, 2014 (TW) .............................. 103131658 A

(51) Int. Cl.

| | |
|---|---|
| *G02B 5/23* | (2006.01) |
| *G02F 1/1335* | (2006.01) |
| *G03F 7/032* | (2006.01) |
| *G02B 5/20* | (2006.01) |
| *G02B 5/22* | (2006.01) |
| *G03F 1/00* | (2012.01) |
| *C09B 67/50* | (2006.01) |

(52) U.S. Cl.
CPC .................. *G03F 7/032* (2013.01); *G02B 5/20* (2013.01); *G02B 5/223* (2013.01); *G02F 1/133514* (2013.01); *G02F 1/133516* (2013.01)

(58) Field of Classification Search
USPC ....... 252/586; 349/106; 430/7, 270.1, 280.1, 430/321
See application file for complete search history.

(56) References Cited

U.S. PATENT DOCUMENTS

| | | | |
|---|---|---|---|
| 2008/0220372 A1* | 9/2008 | Lee ........................ | G03F 7/0007 430/281.1 |
| 2013/0135763 A1* | 5/2013 | Liao ....................... | G03F 7/0757 359/891 |

FOREIGN PATENT DOCUMENTS

| | | |
|---|---|---|
| CN | 102770805 A | 11/2013 |
| JP | 2004138950 | 5/2004 |
| TW | 201321892 A | 6/2013 |

OTHER PUBLICATIONS

English abstract translation of JP 2004138950 Pub. date May 13, 2004.
Search Report issued on Jul. 15, 2015 for the corresponding Taiwan Patent Application No. 103131658.
English translation of the Search Report issued on Jul. 15, 2015 for the corresponding Taiwan Patent Application No. 103131658.
TW201321892A corresponds to US 2013135763 Pub. date May 30, 2013.
English abstract translation of CN102770805A. Pub. date Jul. 11, 2012.

* cited by examiner

*Primary Examiner* — Bijan Ahvazi
(74) *Attorney, Agent, or Firm* — WPAT, P.C., Intellectual Property Attorneys; Anthony King

(57) ABSTRACT

The present invention relates to a photosensitive resin composition for a color filter and uses thereof. The photosensitive resin composition includes an alkali-soluble resin (A), a compound (B) containing an ethylenically unsaturated group, a photoinitiator (C), a pigment (D) and an organic solvent (E). The photosensitive resin composition according to the present invention can improve linearity of pattern with high finesse and developing-resistance of the color filter.

20 Claims, No Drawings

PHOTOSENSITIVE RESIN COMPOSITION FOR COLOR FILTER AND USES THEREOF

BACKGROUND OF THE INVENTION

1. Field of the Invention

The invention relates to a photosensitive resin composition for a color filter in a liquid crystal display element, and a color filter and liquid crystal display element formed by the aforementioned photosensitive resin composition. More particularly, the invention provides a photosensitive resin composition for a color filter having good linearity of pattern with high finesse and developing-resistance.

2. Description of the Related Art

Currently, a color filter has been applied widely in the field such as a color liquid crystal display device, a color fax machine, a color camera or the like. Since the requirement of imaging equipment, such as color liquid crystal display device, has become expanding, the production technology of the color filter also tends to diversify.

The color filter is usually obtained by a dyeing method, a printing method, a plating method, a dispersion method or the like, wherein a red pixel, a green pixel, and a blue pixel are formed on a transparent glass substrate. Generally, in order to raise the contrast of the color filter, a black matrix is usually disposed between colored pixel layers.

The process of the aforementioned dispersion method comprises, first, dispersing pigments in a photo-curing resin to form a colored photosensitive resin composition, and then forming a colored pixel layer with the resin composition. Furthermore, the process of the dispersion method usually comprises using a metal such as chrome or chrome oxide or a photosensitive resin shading film to form a black matrix on a transparent support such as a glass substrate, and coating a photosensitive resin dispersed with a red pigment (also referred as color photoresist) on the transparent support by spin coating. After the steps of exposure with a mask and development, a red pixel can be obtained. Such process is repeated, and a green and blue pixel can be obtained thereby.

In recent years, the application of the color liquid crystal display device is not limited in personal computers, and it has been applied widely in color televisions and various monitor screens (particular in color liquid crystal screens of large sizes), so the requirement for color saturation of the liquid crystal display device becomes higher. Due to the requirement of the high color saturation, it needs to increase the concentration of the pigment, and under the high-concentration pigment, the ratio of the pigment in the photosensitive resin composition is also high which leads the relative used amounts of an alkali-soluble resin and photosensitive monomer to decrease. Such phenomenon causes the decrease of the degree of cross-linking after exposure and then causes poor develop-resistance.

Japanese Patent Publication No. 2004-138950 discloses a specific alkali-soluble resin for forming a colored pixel layer with a good roughness surface and a color filter having good pattern and brightness. However, it tends to lead the linearity of pattern with high finesse of the photosensitive resin composition poor.

Therefore, improving the linearity of pattern with high finesse and developing-resistance simultaneously in order to meet the modern requirements is a target remained to be achieved.

SUMMARY OF THE INVENTION

In the present invention, a specific alkali-soluble resin and a compound containing an ethylenically unsaturated group are provided to obtain a photosensitive resin composition having good linearity of pattern with high finesse and developing-resistance.

Therefore, the present invention relates to a photosensitive resin composition for a color filter comprising:
  an alkali-soluble resin (A);
  a compound (B) containing an ethylenically unsaturated group;
  a photoinitiator (C);
  a pigment (D); and
  an organic solvent (E);
wherein:
  the compound (B) containing the ethylenically unsaturated group comprises a first compound (B-1) having an ethylenically unsaturated group obtained by reacting a mixture, and the mixture comprises an epoxy compound (b-1-1) represented by Formula (1) and a compound (b-1-2) having at least one carboxylic acid group and at least one ethylenically unsaturated group;

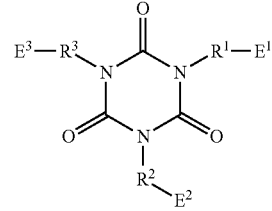

Formula (1)

in Formula (1):
$R^1$, $R^2$ and $R^3$ independently represent a branched or linear $C_1$-$C_6$ alkylene group or a branched or linear $C_1$-$C_6$ oxyalkylene group;
$E^1$, $E^2$ and $E^3$ independently represent an epoxy-containing group represented by Formula (2), an organic group represented by Formula (3) or a hydrogen atom, wherein at least one of $E^1$, $E^2$ and $E^3$ represents the epoxy-containing group represented by Formula (2); and

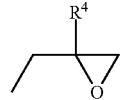

Formula (2)

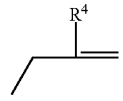

Formula (3)

in Formulae (2) and (3), $R^4$ represents a hydrogen atom or a methyl group.

The present invention also provides a method for manufacturing a color filter comprising forming a pixel layer with the photosensitive resin composition as mentioned above.

The present invention also provides a color filter manufactured by the method as mentioned above.

The present invention further provides a liquid crystal display element comprising the color filter as mentioned above.

DETAILED DESCRIPTION OF THE INVENTION

The present invention provides a photosensitive resin composition for a color filter comprising:
an alkali-soluble resin (A);
a compound (B) containing an ethylenically unsaturated group;
a photoinitiator (C);
a pigment (D); and
an organic solvent (E);
wherein:
the compound (B) containing the ethylenically unsaturated group comprises a first compound (B-1) having an ethylenically unsaturated group obtained by reacting a mixture, and the mixture comprises an epoxy compound (b-1-1) represented by Formula (1) and a compound (b-1-2) having at least one carboxylic acid group and at least one ethylenically unsaturated group;

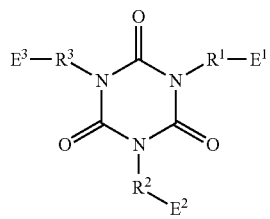

Formula (1)

in Formula (1):
$R^1$, $R^2$ and $R^3$ independently represent a branched or linear $C_1$-$C_6$ alkylene group or a branched or linear $C_1$-$C_6$ oxyalkylene group;
$E^1$, $E^2$ and $E^3$ independently represent an epoxy-containing group represented by Formula (2), an organic group represented by Formula (3) or a hydrogen atom, wherein at least one of $E^1$, $E^2$ and $E^3$ represents the epoxy-containing group represented by Formula (2); and

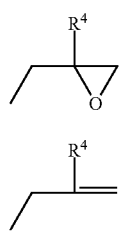

Formula (2)

Formula (3)

in Formulae (2) and (3), $R^4$ represents a hydrogen atom or a methyl group.

The alkali-soluble resin (A) according to the invention comprises a first alkali-soluble resin (A-1) and may further comprise a second alkali-soluble resin (A-2).

The first alkali-soluble resin (A-1) is obtained by reacting a first mixture, and the first mixture comprises an epoxy compound (a-1) having at least two epoxy groups and a compound (a-2) having at least one carboxylic acid group and at least one ethylenically unsaturated group. Besides, the first mixture may optionally comprise a carboxylic anhydride compound (a-3), a compound (a-4) having an epoxy group or combinations thereof.

The epoxy compound (a-1) having at least two epoxy groups contains a compound represented by Formula (5), a compound represented by Formula (6) or combinations thereof.

In one embodiment of the invention, the compound represented by Formula (5) is shown below:

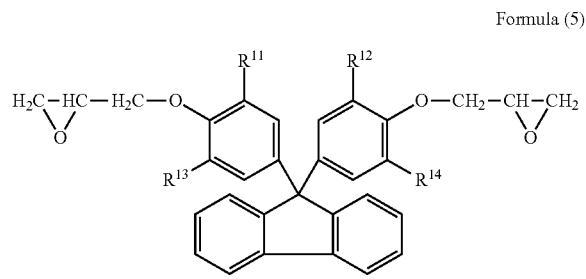

Formula (5)

in Formula (5), $R^{11}$, $R^{12}$, $R^{13}$ and $R^{14}$ independently represent a hydrogen atom, a halogen atom, a $C_1$-$C_5$ alkyl group, a $C_1$-$C_5$ alkoxy group, a $C_6$-$C_{12}$ aryl group or a $C_6$-$C_{12}$ aralkyl group.

The aforementioned compound represented by Formula (5) includes but is not limited to a compound obtained by reacting a bisphenol fluorene and an epihalohydrin.

Examples of the aforementioned bisphenol fluorene include but are not limited to 9,9-bis(4-hydroxyphenyl) fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene or the like.

Examples of the aforementioned epihalohydrin include but are not limited to 3-chloro-1,2-epichlorohydrin, 3-bromo-1,2-epibromohydrin or the like.

The compound represented by Formula (5) is bisphenol fluorene containing the epoxy group. Examples of the aforementioned compound include but are not limited to: (1) ESF-300 or the like manufactured by Nippon Steel Chemical Co., Ltd; (2) PG-100, EG-210 or the like manufactured by Osaka Gas Co., Ltd; (3) SMS-F9PhPG, SMS-F9CrG, SMS-F914PG or the like manufactured by S.M.S Technology Co., Ltd.

In other embodiment of the invention, the compound represented by Formula (6) is shown below:

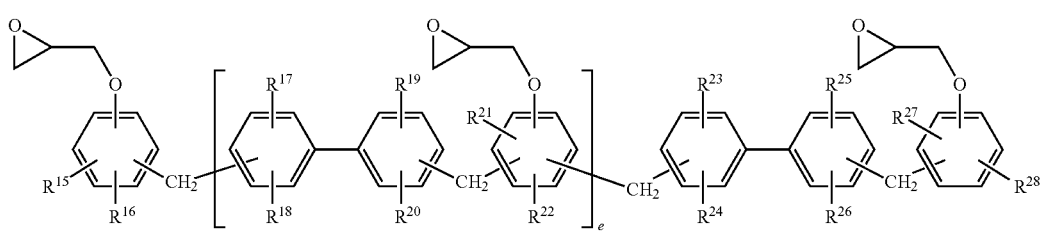

Formula (6)

in Formula (6), $R^{15}$ to $R^{28}$ independently represent a hydrogen atom, a halogen atom, a $C_1$-$C_8$ alkyl group, or a $C_6$-$C_{15}$ aromatic group; and e represents an integer from 0 to 10.

The aforementioned compound represented by Formula (6) is obtained by reacting a compound represented by Formula (6-1) as below and an epihalohydrin in the presence of an alkali metal hydroxide:

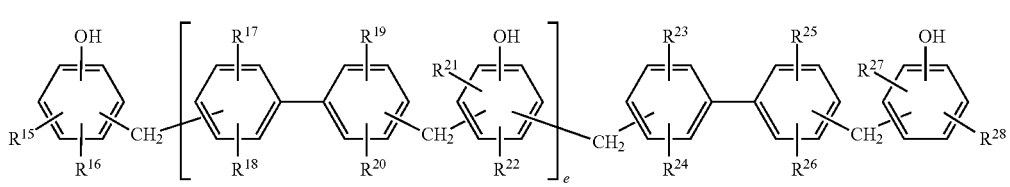

Formula (6-1)

in Formula (6-1), $R^{15}$ to $R^{28}$ and e are the same to the definition with Formula (6), and are not repeated again.

The aforementioned compound represented by Formula (6) is obtained by condensing a compound represented by Formula (6-2) and phenol in the presence of an acid catalyst, thereby forming the compound represented by Formula (6-1). Next, a dehydrohalogenation is carried out by adding excess of an epihalohydrin into the above reaction solution, so as to obtain the compound represented by Formula (6).

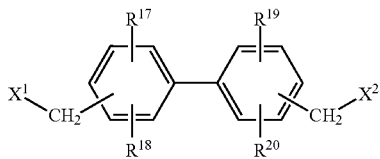

Formula (6-2)

In Formula (6-2), $R^{17}$ and $R^{20}$ are the same to the definition with Formula (6), and are not repeated again; $X^1$ and $X^2$ independently represent a halogen atom, a $C_1$-$C_6$ alkyl group or a $C_1$-$C_6$ alkoxy group. Preferably, the halogen atom may be chlorine or bromine; the alkyl group may be a methyl, ethyl or tert-butyl group; and the alkoxy group may be a methoxy or ethoxy group.

Examples of the aforementioned phenol include but are not limited to phenol, cresol, ethylphenol, n-propylphenol, isobutylphenol, t-butylphenol, octylphenol, nonylphenol, xylenol, methylbutylphenol, di-t-butylphenol, vinylphenol, propenylphenol, ethinylphenol, cyclopentylphenol, cyclohexylphenol, cyclohexylcresol or the like. The aforementioned phenols may be used alone or in admixture of two or more thereof.

Based on 1 mole of the used amount of the aforementioned compound represented by Formula (6-2), the used amount of the phenol is 0.5 to 20 moles; preferably the used amount of the phenol is 2 to 15 moles.

Examples of the aforementioned acid catalyst include but are not limited to hydrogen chloride, sulfuric acid, p-toluenesulfonic acid, oxalic acid, boron trifluoride, aluminium chloride anhydrous, zinc chloride or the like; wherein p-toluenesulfonic acid, hydrogen chloride and sulfuric acid are preferably used. The aforementioned acid catalyst may be used alone or in admixture of two or more thereof.

In addition, there are no specific limitations to the used amount of the aforementioned acid catalyst. Preferably, based on 100 percentages by weight of the compound represented by Formula (6-2), the used amount of the acid catalyst is 0.1 percentages by weight to 30 percentages by weight.

The aforementioned condensation reaction may be performed without any solvent or in the presence of an organic solvent. Examples of the aforementioned organic solvent are toluene, xylene, methyl isobutyl ketone or the like. The aforementioned organic solvent may be used alone or in admixture of two or more thereof.

Based on 100 percentages by weight of the total used amount of the compound represented by Formula (6-2) and the phenol, the used amount of the organic solvent is 50 percentages by weight to 300 percentages by weight; preferably 100 percentages by weight to 250 percentages by weight. In addition, the aforementioned condensation reaction is operated under a temperature of 40° C. to 180° C. for a period of 1 hour to 8 hours.

After the condensation reaction is finished, a neutralization or rinse treatment may be performed. In the aforementioned neutralization treatment, pH value of the reaction solution is adjusted to pH 3 to pH 7, and preferably pH 5 to pH 7. A neutralization reagent may be used in the aforementioned rinse treatment, in which the neutralization reagent is an alkaline substance, for examples, alkali metal hydroxides such as sodium hydroxide, potassium hydroxide or the like; alkaline earth metal hydroxides such as calcium hydroxide, magnesium hydroxide or the like; organic amines such as diethylene triamine, triethylenetetramine, aniline, phenylene diamine or the like; and ammonia, sodium dihydrogen phosphate or combinations thereof. The neutralization reagent may be used alone or in combinations. Conventional manners may be used in the aforementioned rinse treatment. For example, a neutralizing reagent-containing solution is added into the reaction solution followed by repetitively extracting. After the neutralization or rinse treatment is finished, unreactive phenols and solvents in the product are evaporated and removed by using a heating treatment under a decreased pressure, and then concentrated, thereby obtaining the compound represented by Formula (6-1).

Examples of the aforementioned epihalohydrin include but are not limited to 3-chloro-1,2-epichlorohydrin, 3-bromo-1,2-epibromohydrin or combinations thereof. Before preceding the aforementioned dehydrohalogenation, alkali metal hydroxides such as sodium hydroxide, potassium hydroxide may be added before or during the reaction process. The aforementioned dehydrohalogenation is carried out under a temperature of 20° C. to 120° C. for a period of 1 hour to 10 hours.

In one embodiment, the formulation of the alkali metal hydroxide may be also used in an aqueous solution for adding into the aforementioned dehydrohalogenation reaction system. In the embodiment, when the solution of the alkali metal hydroxides is continuously added into the dehydrohalogenation reaction system, water and the epihalohydrin can be simultaneously distilled out under a normal or decreased pressure, thereby separating and removing water, as well as reflowing the epihalohydrin back into the reaction system continuously.

Before the aforementioned dehydrohalogenation is carried out, a tertiary ammonium salt such as tetramethyl ammonium chloride, tetramethyl ammonium bromide, trimethyl benzyl ammonium chloride or the like may be used as a catalyst and added into the dehydrohalogenation reaction system, followed by performing the dehydrohalogenation under a temperature of 50° C. to 150° C. for a period of 1 hour to 5 hours. Next, the alkali metal hydroxide or its solution may be then added into such reaction system under a temperature of 20° C. to 120° C. for a period of 1 hour to 10 hours for carrying out the dehydrohalogenation.

Based on the total hydroxyl groups in the compound represented by Formula (6-1) as 1 equivalent, the used amount of the epihalohydrin is 1 equivalent to 20 equivalents; preferably 2 equivalents to 10 equivalents. Based on the total hydroxyl groups in the compound represented by Formula (6-1) as 1 equivalent, the used amount of the alkali metal hydroxide added in the dehydrohalogenation is 0.8 equivalents to 15 equivalents; preferably 0.9 equivalents to 11 equivalents.

In addition, for the purpose of success of the dehydrohalogenation, an alcohol such as methanol or ethanol, a polar aprotic solvent such as dimethyl sulfone, dimethyl sulfoxide or the like may be also added. When the alcohol is used in the reaction, based on 100 percentages by weight of the used amount of the epihalohydrin, the used amount of the alcohol is 2 percentages by weight to 20 percentages by weight; preferably 4 percentages by weight to 15 percentages by weight. When the polar aprotic solvent is used in the reaction, based on 100 percentages by weight of the used amount of the epihalohydrin, the used amount of the polar aprotic solvent is 5 percentages by weight to 100 percentages by weight; preferably 10 percentages by weight to 90 percentages by weight.

After the dehydrohalogenation is completed, a rinse treatment is optionally performed. Afterward, the epihalohydrin, the alcohol and the polar aprotic solvent can be removed by using a heating treatment of 110° C. to 250° C. under a decreased pressure of less than 1.3 kPa (10 mmHg).

For preventing the resulted epoxy resin from remaining hydrolytic halogen therein, toluene, methyl isobutyl ketone or the like may be added into the solution that has reacted after the dehydrohalogenation, and then the solution of the alkali metal hydroxide such as sodium hydroxide, potassium hydroxide may be added to perform the dehydrohalogenation again. During the dehydrohalogenation, based on the total hydroxyl groups in the compound represented in Formula (6-1) as 1 equivalent, the used amount of the alkali metal hydroxide added in the dehydrohalogenation is 0.01 moles to 0.3 moles; preferably 0.05 moles to 0.2 moles. In addition, the dehydrohalogenation is operated in a temperature of 50° C. to 120° C. for a period of 0.5 hours to 2 hours.

After the dehydrohalogenation is finished, salts can be removed by using processes of filtration, rinse and so on. In addition, toluene, methyl isobutyl ketone and the like can be distilled out and removed, thereby obtaining the compound represented by Formula (6). Examples of the compound represented by Formula (6) include but are not limited to the commercially available products such as NC-3000, NC-3000H, NC-3000S, NC-3000P or so on manufactured by Nippon Kayaku Co., Ltd.

The aforementioned the compound (a-2) having at least one carboxylic acid group and at least one ethylenically unsaturated group may be selected from the group consisting of the following subgroups (1) to (3): (1) acrylic acid, methacrylic acid, 2-methacryloyloxyethyl butanedioic acid, 2-methacryloyloxybutyl butanedioic acid, 2-methacryloyloxyethyl hexanedioic acid, 2-methacryloyloxybutyl hexanedioic acid, 2-methacryloyloxyethyl hexahydrophthalic acid, 2-methacryloyloxyethyl maleic acid, 2-methacryloyloxypropyl maleic acid, 2-methacryloyloxybutyl maleic acid, 2-methacryloyloxypropyl butanedioic acid, 2-methacryloyloxypropyl hexanedioic acid, 2-methacryloyloxypropyl tetrahydrophthalic acid, 2-methacryloyloxypropyl phthalic acid, 2-methacryloyloxybutyl phthalic acid, or 2-methacryloyloxybutyl hydrophthalic acid; (2) a compound obtained by reacting (methyl)acrylate ester containing a hydroxyl group with a dicarboxylic acid compound, in which the dicarboxylic acid compound includes but is not limited to hexanedioic acid, butanedioic acid, maleic acid or phthalic acid; and (3) a hemiester compound obtained by reacting (methyl)acrylate ester containing a hydroxyl group with a carboxylic anhydride compound (a-3), in which the (methyl)acrylate ester containing a hydroxyl group includes but is not limited to (2-hydroxyethyl) acrylate, (2-hydroxyethyl) methacrylate, (2-hydroxypropyl) acrylate, (2-hydroxypropyl) methacrylate, (4-hydroxybutyl) acrylate, (4-hydroxybutyl) methacrylate, pentaerythritol triacrylate or the like.

The aforementioned carboxylic anhydride compound (a-3) may be selected from the group consisting of the following subgroups (1) to (2): (1) dicarboxylic anhydride compounds such as butanedioic anhydride, maleic anhydride, itaconic anhydride, phthalic anhydride, tetrahydrophthalic anhydride, hexahydrophthalic anhydride, methyl tetrahydrophthalic anhydride, methyl hexahydrophthalic anhydride, methyl endo-methylene tetrahydrophthalic anhydride, chlorendic anhydride, glutaric anhydrid, 1,2,4-benzenetricarboxylic anhydride and the like; and (2) tetracarboxylic dianhydride compounds such as benzophenone tetracarboxylic dianhydride (referred to as BTDA), diphenyl tetracarboxylic acid dianhydride, diphenyl ether tetracarboxylic acid dianhydride and the like.

Examples of the aforementioned compound (a-4) having the epoxy group are glycidyl methacrylate, 3,4-epoxycyclohexyl methacrylate, a glycidyl ether compound containing an unsaturated group, an unsaturated compound containing an epoxy group or any combinations thereof. Examples of the glycidyl ether compound containing the unsaturated group include but are not limited to the commercially available products such as Denacol EX-111, Denacol EX-121, Denacol EX-141, Denacol EX-145, Denacol EX-146, Denacol EX-171, Denacol EX-192 manufactured by Nagase ChemteX Corporation or the like.

In one embodiment of the invention, the epoxy compound (a-1) having at least two epoxy groups and the compound (a-2) having at least one carboxylic acid group and at least one ethylenically unsaturated group are polymerized to form an intermediate product containing a hydroxyl group; wherein the epoxy compound (a-1) having at least two epoxy groups is the compound represented by Formula (5), and then the intermediate product reacts with the carboxylic acid anhydride compound (a-3), so as to obtain the first alkali-soluble resin (A-1). Based on the total amount of the hydroxyl group as 1 equivalent, the used amount of the carboxylic acid anhydride compound (a-3) is preferably from 0.4 to 1 equivalent, and more preferably 0.75 to 1 equivalent. When pluralities of the carboxylic acid anhydride compounds (a-3) are used in this reaction, they may be added sequentially or simultaneously in the reaction. Preferably, when the dicarboxylic acid anhydride compound and the tetracarboxylic acid anhydride compound are employed as the carboxylic acid anhydride compound (a-3), the molar ratio of dicarboxylic acid anhydride compound to the tetracarboxylic acid anhydride compound may be 1/99 to 90/10, and preferably 5/95 to 80/20. In addition, this reaction may be operated under a temperature of 50° C. to 130° C.

In other embodiment of the invention, the aforementioned first alkali-soluble resin (A-1) may be synthesized as follows. The epoxy compound (a-1) having at least two epoxy groups and the compound (a-2) having at least one carboxyl group and at least one ethylenically unsaturated group are polymerized to form an intermediate product containing a hydroxyl group; wherein the epoxy compound (a-1) having at least two epoxy groups is the compound represented by Formula (5), and then the intermediate product reacts with the carboxylic acid anhydride compound (a-3), the compound (a-4) containing the epoxy group or any combination thereof, so as to obtain the first alkali-soluble resin (A-1). Based on the total amount of the epoxy groups of the epoxy compound containing at least two epoxy groups represented by Formula (5) as 1 equivalent, the used amount of the compound (a-2) having at least one carboxyl group and at least one ethylenically unsaturated group is from 0.8 to 1.5 equivalent, and preferably 0.9 to 1.1 equivalent. Based on the total hydroxyl groups of the intermediate product containing the hydroxyl group as 100 percentage by mole (mole %), the used amount of the carboxylic acid anhydride compound (a-3) is from 10 to 100 mole %, preferably 20 to 100 mole %, and more preferably 30 to 100 mole %.

During the preparation of the first alkali-soluble resin (A-1), the reaction solution is usually added with an alkaline compound as a reaction catalyst for accelerating the reaction. Examples of the reaction catalyst include but are not limited to triphenyl phosphine, triphenyl stibine, triethylamine, triethanolamine, tetramethylammonium chloride, benzyltriethylammonium chloride or the like. The reaction catalyst may be used alone or in combinations of two or more.

Based on 100 parts by weight of the total used amount of the epoxy compound (a-1) having at least two epoxy groups and the compound (a-2) having at least one carboxyl group and at least one ethylenically unsaturated group, the used amount of the reaction catalyst is from 0.01 to 10 parts by weight, and preferably 0.3 to 5 parts by weight.

In addition, for the purpose of controlling the polymerization degree, a polymerization inhibitor is usually added into the reaction solution. Examples of the aforementioned polymerization inhibitor include but are not limited to methoxyphenol, methylhydroquinone, hydroquinone, 2,6-di-t-butyl-p-cresol, phenothiazine or the like. The polymerization inhibitor may be used alone or in combinations of two or more.

Based on 100 parts by weight of the total used amount of the epoxy compound (a-1) having at least two epoxy groups and the compound (a-2) having at least one carboxyl group and at least one ethylenically unsaturated group, the used amount of the polymerization inhibitor is from 0.01 to 10 parts by weight, and preferably 0.1 to 5 parts by weight.

During the preparation of the first alkali-soluble resin (A-1), a polymerization solvent may be used if necessary. Examples of the polymerization solvent include but are not limited to alcohol compounds such as ethanol, propanol, isopropanol, butanol, isobutanol, 2-butanol, hexanol or ethylene glycol; ketone compounds such as methyl ethyl ketone or cyclohexanone; aromatic hydrocarbon compounds such as toluene or xylene; cellosolve compounds such as cellosolve or butyl cellosolve; carbitol compounds such as carbitol or butyl carbitol; propylene glycol alkyl ether compounds such as propylene glycol monomethyl ether; poly(propylene glycol) alkyl ether compounds such as di(propylene glycol) methyl ether, acetate ester compounds such as ethyl acetate, butyl acetate, ethylene glycol monoethyl ether acetate, propylene glycol methyl ether acetate and the like; alkyl lactate compounds such as ethyl lactate or butyl lactate; or dialkyl glycol ethers. The aforementioned polymerization solvent may be used alone or in combinations of two or more. Besides, an acid equivalent of the first alkali-soluble resin (A-1) is 50 mg KOH/g to 200 mg KOH/g, and preferably 60 mg KOH/g to 150 mg KOH/g.

Based on 100 parts by weight of the used amount of the alkali-soluble resin (A), the used amount of the first alkali-soluble resin (A-1) is from 3 parts by weight to 100 parts by weight, preferably from 4 parts by weight to 80 parts by weight, and more preferably from 5 parts by weight to 60 parts by weight. If the alkali-soluble resin (A) comprises the first alkali-soluble resin (A-1), the photosensitive resin composition for a color filter has good developing-resistance.

The second alkali-soluble resin (A-2) is polymerized by an ethylenically unsaturated monomer (a-5) having at least one carboxylic acid group and an other copolymerizable ethylenically unsaturated monomer (a-6), and the used amount of the ethylenically unsaturated monomer (a-5) having at least one carboxylic acid group and the other copolymerizable ethylenically unsaturated monomer (a-6) is 100 parts by weight.

Examples of the ethylenically unsaturated monomer (a-5) having at least one carboxylic acid group include but are not limited to an unsaturated monocarboxylic compound such as acrylic acid, methacrylic acid, butenic acid, α-chloro acrylic acid, ethyl acrylic acid, benzalacetic acid, 2-acryloyloxyethylsuccinate monoester, 2-methacryloyloxyethyl succinate monoester or the like; an unsaturated dicarboxylic acid (anhydride) compound such as maleic acid, maleic anhydride, fumaric acid, itaconic acid, itaconic anhydride, citraconic acid, citraconic anhydride or the like; and an unsaturated polycarboxylic acid (anhydride) compound having more than three carboxyl groups. The aforementioned ethylenically unsaturated monomer having at least one carboxylic acid group (a-5) may be used alone or in combinations of two or more.

Preferably, the aforementioned ethylenically unsaturated monomer having at least one carboxylic acid group (a-5) is acrylic acid, methacrylic acid, 2-acryloyloxyethylsuccinate monoester, 2-methacryloyloxyethyl succinate monoester or the like.

Examples of the other copolymerizable ethylenically unsaturated monomer (a-6) include but are not limited to dicyclopentyl acrylate, dicyclopentyloxyethyl acrylate, dicyclopentenyl acrylate (FA-511A), dicyclopentenyloxyethyl acrylate (FA-512A), dicyclopentyl methacrylate, dicyclopentyloxyethyl methacrylate, dicyclopentenyl methacrylate, dicyclopentenyloxyethyl methacrylate, aromatic ethylenically compounds such as styrene, α-methylstyrene, vinyl toluene, p-chlorostyrene, methoxystyrene or the like; maleimide compounds such as N-phenylmaleimide, N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide, N-cyclohexylmaleimide or the like; unsaturated carboxylic acid ester compounds such as methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, sec-butyl acrylate, sec-butyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, propylene acrylate, propylene methacrylate, benzyl acrylate, benzyl methacrylate, phenyl acrylate, phenyl methacrylate, methoxy triethylene glycol acrylate, methoxy triethylene glycol methacrylate, lauryl methacrylate, tetradecyl methacrylate, cetyl methacrylate, octadecyl methacrylate, eicosyl methacrylate, docosanyl methacrylate or the like; N,N-dimethyl amino ethyl acrylate, N,N-dimethyl amino ethyl methacrylate, N,N-diethyl amino propyl acrylate, N,N-dimethyl amino propyl methacrylate, N,N-dibutyl amino propyl acrylate or N-isobutyl amino ethyl methacrylate; unsaturated carboxylic epoxypropyl ester compounds such as epoxypropyl acrylate, epoxypropyl methacrylate or the like; vinyl carboxylate compounds such as vinyl acetate, vinyl pivalate, vinyl butanoate or the like; unsaturated ether compounds such as methoxyethene, ethoxyethene, allyl epoxypropyl ether, methallyl epoxypropyl ether or the like; vinyl nitrile compounds such as acrylonitrile, methacrylonitrile, α-chloro acrylonitrile, vinylidene cyanide or the like; unsaturated amide compounds such as acrylamide, methacrylamide, α-chloro acrylamide, N-hydroxyethyl acrylamide, N-hydroxyethyl methacrylamide or the like; and aliphatic conjugated diene compounds such as 1,3-butadiene, isoprene, chlorinated butadiene or the like. The aforementioned other copolymerizable ethylenically unsaturated monomer (a-6) may be used alone or in combinations of two or more.

Preferably, the other copolymerizable ethylenically unsaturated monomer (a-6) is selected from dicyclopentyl acrylate, dicyclopentyloxyethyl acrylate, dicyclopentenyl acrylate, dicyclopentenyloxyethyl acrylate, dicyclopentyl methacrylate, dicyclopentyloxyethyl methacrylate, dicyclopentenyl methacrylate, dicyclopentenyloxyethyl methacrylate, styrene, N-phenylmaleimide, methacrylate, methyl methacrylate, 2-hydroxyethyl acrylate, 2-hydroxyethyl methacrylate, benzyl acrylate, benzyl methacrylate or in any combination thereof.

During the preparation of the second alkali-soluble resin (A-2), examples of the solvent include but are not limited to (poly)alkylene glycol monoalkylether, such as ethylene glycol monomethylether, ethylene glycol monoethylether, diethylene glycol monomethylether, diethylene glycol monoethylether, diethylene glycol n-propylether, diethylene glycol n-butylether, triethylene glycol monomethylether, triethylene glycol monoethylether, propylene glycol monomethylether, propylene glycol monoethylether, dipropylene glycol monomethylether, dipropylene glycol monoethylether, dipropylene glycol n-propylether, dipropylene glycol n-butylether, tripropylene glycol monomethyl ether, tripropylene glycol monoethyl ether or the like; (poly)alkylene glycol monoalkylether acetate such as ethylene glycol monomethylether acetate, ethylene glycol monoethylether acetate, propylene glycol monomethylether acetate, propylene glycol monoethylether acetate or the like; ether such as diethylene glycol dimethyl ether, diethylene glycol ethyl methyl ether, diethylene glycol diethyl ether, tetrahydrofuran or the like; ketone such as methyl ethyl ketone, cyclohexanone, 2-heptanone, 3-heptanone or the like; lactic alkyoxycarbonyl such as methyl 2-hydroxypropanoate, ethyl 2-hydroxypropanoate or the like; ester such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethoxy ethyl acetate, hydroxy ethyl acetate, methyl 2-hydroxy-3-methylbutyrate, 3-methyl-3-methoxybutyl acetate, 3-methyl-3-methoxybutyl acrylic acid, ethyl acetate, n-butyl acetate, n-propyl acetate, isopropyl acetate, isobutyl acetate, n-pentyl acetate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, 2-oxide-butyric acid ethyl ester or the like; aromatic hydrocarbons such as toluene, xylene or the like; carboxylic acid amide such as N-methyl-pyrrolidinone, N,N-dimethyl formamide, N,N-dimethyl acetamide or the like. The aforementioned solvent may generally be used alone or in combination.

Preferably, the aforementioned solvent is propylene glycol monomethylether acetate, ethyl 3-ethoxypropionate or combinations thereof.

During the preparation of the second alkali-soluble resin (A-2), the initiator may be a free radical initiator. Examples of the free radical initiator include but are not limited to azo compound such as 2,2'-azobisisobutyronitrile, 2,2'-azobis-(2,4-dimethylvaleronitrile), 2,2'-azobis-(4-methoxy-2,4-dimethylvaleronitrile), 2,2'-azobis-2-methyl butyronitrile or the like; peroxide such as benzoylperoxide or the like.

Based on 100 parts by weight of the used amount of the alkali-soluble resin (A), the used amount of the second alkali-soluble resin (A-2) is from 0 part by weight to 97 parts by weight, preferably from 20 parts by weight to 96 parts by weight, and more preferably from 40 parts by weight to 95 parts by weight.

The compound (B) containing the ethylenically unsaturated group according to the invention comprises a first compound (B-1) having an ethylenically unsaturated group obtained by reacting a mixture, and the mixture comprises an epoxy compound (b-1-1) represented by Formula (1) and a compound (b-1-2) having at least one carboxylic acid group and at least one ethylenically unsaturated group;

Formula (1)

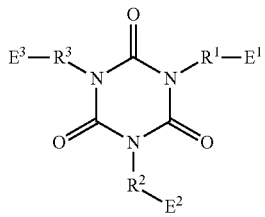

in Formula (1):

$R^1$, $R^2$ and $R^3$ independently represent a branched or linear $C_1$-$C_6$ alkylene group or a branched or linear $C_1$-$C_6$ oxyalkylene group;

$E^1$, $E^2$ and $E^3$ independently represent an epoxy-containing group represented by Formula (2), an organic group represented by Formula (3) or a hydrogen atom, wherein at least one of $E^1$, $E^2$ and $E^3$ represents the epoxy-containing group represented by Formula (2); and Formula (2)

Formula (3)

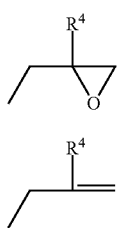

in Formulae (2) and (3), $R^4$ represents a hydrogen atom or a methyl group.

Examples of the $C_1$-$C_6$ alkylene group include but are not limited to methylenyl, ethylenyl, n-propenyl, isopropenyl, cyclopropenyl, n-butenyl, isobutenyl, s-butenyl, t-butenyl, cyclobutenyl, 1-methyl-cyclopropenyl, 2-methyl-cyclopropenyl, n-pentenyl, 1-methyl-n-butenyl, 2-methyl-n-butenyl, 3-methyl-n-butenyl, 1,1-dimethyl-n-propenyl, 1,2-dimethyl-n-propenyl, 2,2-dimethyl-n-propenyl, 1-ethyl-n-propenyl, cyclopentenyl, 1-methyl-cyclobutenyl, 2-methyl-cyclobutenyl, 3-methyl-cyclobutenyl, 1,2-dimethyl-cyclopropenyl, 2,3-dimethyl-cyclopropenyl, 1-ethyl-cyclopropenyl, 2-ethyl-cyclopropenyl, n-hexenyl, 1-methyl-n-pentenyl, 2-methyl-n-pentenyl, 3-methyl-n-pentenyl, 4-methyl-n-pentenyl, 1,1-dimethyl-n-butenyl, 1,2-dimethyl-n-butenyl, 1,3-dimethyl-n-butenyl, 2,2-dimethyl-n-butenyl, 2,3-dimethyl-n-butenyl, 3,3-dimethyl-n-butenyl, 1-ethyl-n-butenyl, 2-ethyl-n-butenyl, 1,1,2-trimethyl-n-propenyl, 1,2,2-trimethyl-n-propenyl, 1-ethyl-1-methyl-n-propenyl, 1-ethyl-2-methyl-n-propenyl, cyclohexenyl, 1-methyl-cyclopentenyl, 2-methyl-cyclopentenyl, 3-methyl-cyclopentenyl, 1-ethyl-cyclobutenyl, 2-ethyl-cyclobutenyl, 3-ethyl-cyclobutenyl, 1,2-dimethyl-cyclobutenyl, 1,3-dimethyl-cyclobutenyl, 2,2-dimethyl-cyclobutenyl, 2,3-dimethyl-cyclobutenyl, 2,4-dimethyl-cyclobutenyl, 3,3-dimethyl-cyclobutenyl, 1-n-propyl-cyclopropenyl, 2-n-propyl-cyclopropenyl, 1-isopropyl-cyclopropenyl, 2-isopropyl-cyclopropenyl, 1,2,2-trimethyl-cyclopropenyl, 1,2,3-trimethyl-cyclopropenyl, 2,2,3-trimethyl-cyclopropenyl, 1-ethyl-2-methyl-cyclopropenyl, 2-ethyl-1-methyl-cyclopropenyl, 2-ethyl-2-methyl-cyclopropenyl, 2-ethyl-3-methyl-cyclopropenyl or the like. Preferably, the alkylene group is a $C_1$-$C_3$ alkylene group.

Examples of the $C_1$-$C_6$ oxyalkylene group include but are not limited to oxymethylenyl, oxyethylenyl, oxy-n-propenyl, oxyisopropenyl, oxycyclopropenyl, oxy-n-butenyl, oxyisobutenyl, oxy-s-butenyl, oxy-t-butenyl, oxycyclobutenyl, oxy-1-methyl-cyclopropenyl, oxy-2-methyl-cyclopropenyl, oxy-n-pentenyl, oxy-1-methyl-n-butenyl, oxy-2-methyl-n-butenyl, oxy-3-methyl-n-butenyl, oxy-1,1-dimethyl-n-propenyl, oxy-1,2-dimethyl-n-propenyl, oxy-2,2-dimethyl-n-propenyl, oxy-1-ethyl-n-propenyl, oxycyclopentenyl, oxy-1-methyl-cyclobutenyl, oxy-2-methyl-cyclobutenyl, oxy-3-methyl-cyclobutenyl, oxy-1,2-dimethyl-cyclopropenyl, oxy-2,3-dimethyl-cyclopropenyl, oxy-1-ethyl-cyclopropenyl, oxy-2-ethyl-cyclopropenyl, oxy-n-hexenyl, oxy-1-methyl-n-pentenyl, oxy-2-methyl-n-pentenyl, oxy-3-methyl-n-pentenyl, oxy-4-methyl-n-pentenyl, oxy-1,1-dimethyl-n-butenyl, oxy-1,2-dimethyl-n-butenyl, oxy-1,3-dimethyl-n-butenyl, oxy-2,2-dimethyl-n-butenyl, oxy-2,3-dimethyl-n-butenyl, oxy-3,3-dimethyl-n-butenyl, oxy-1-ethyl-n-butenyl, oxy-2-ethyl-n-butenyl, oxy-1,1,2-trimethyl-n-propenyl, oxy-1,2,2-trimethyl-n-propenyl, oxy-1-ethyl-1-methyl-n-propenyl, oxy-1-ethyl-2-methyl-n-propenyl, oxycyclohexenyl, oxy-1-methyl-cyclopentenyl, oxy-2-methyl-cyclopentenyl, oxy-3-methyl-cyclopentenyl, oxy-1-ethyl-cyclobutenyl, oxy-2-ethyl-cyclobutenyl, oxy-3-ethyl-cyclobutenyl, oxy-1,2-dimethyl-cyclobutenyl, oxy-1,3-dimethyl-cyclobutenyl, oxy-2,2-dimethyl-cyclobutenyl, oxy-2,3-dimethyl-cyclobutenyl, oxy-2,4-dimethyl-cyclobutenyl, oxy-3,3-dimethyl-cyclobutenyl, oxy-1-n-propyl-cyclopropenyl, oxy-2-n-propyl-cyclopropenyl, oxy-1-isopropyl-cyclopropenyl, oxy-2-isopropyl-cyclopropenyl, oxy-1,2,2-trimethyl-cyclopropenyl, oxy-1,2,3-trimethyl-cyclopropenyl, oxy-2,2,3-trimethyl-cyclopropenyl, oxy-1-ethyl-2-methyl-cyclopropenyl, oxy-2-ethyl-1-methyl-cyclopropenyl, oxy-2-ethyl-2-methyl-cyclopropenyl, oxy-2-ethyl-3-methyl-cyclopropenyl or the like. Preferably, the oxyalkylene group is oxyethylenyl or oxyisopropenyl.

Preferably, $R^1$, $R^2$ and $R^3$ represent a $C_1$-$C_3$ alkylene group.

Preferably, at least two of $E^1$, $E^2$ and $E^3$ represent the epoxy-containing group represented by Formula (2).

In one preferred embodiment of the invention, the epoxy compound (b-1-1) represented by Formula (1) include but are not limited to monoallyldiglycidyl isocyanurate, 1-allyl-3,5-bis (2-methyl-epoxy propyl) isocyanurate, 1-(2-methyl-propenyl)-3,5-diglycidyl isocyanurate, 1-(2-methyl-propenyl)-3,5-bis(2-methyl-epoxy propyl) isocyanurate, diallylmonoglycidyl isocyanurate, 1,3-diallyl-5-(2-methyl-epoxypropyl) isocyanurate, 1,3-bis(2-methyl-propenyl)-5-glycidyl isocyanurate, 1,3-bis(2-methyl-propenyl)-5-(2-methyl-epoxypropyl) isocyanurate or epoxy compounds represented by Formulae (1-1) to (1-21) shown below:

Formula (1-1)

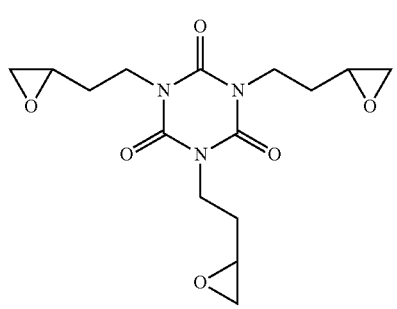

Formula (1-2)
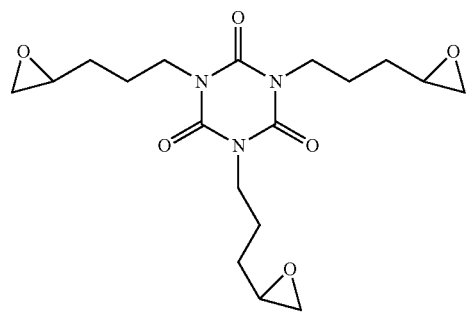
Formula (1-3)
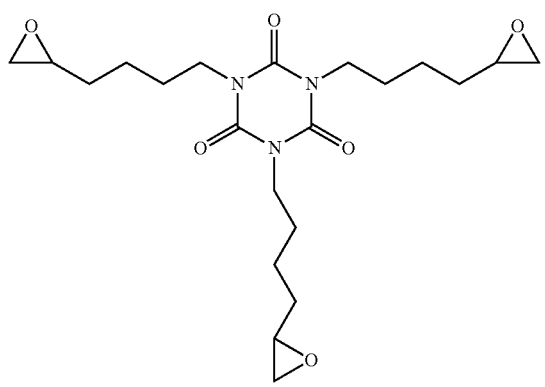
Formula (1-4)
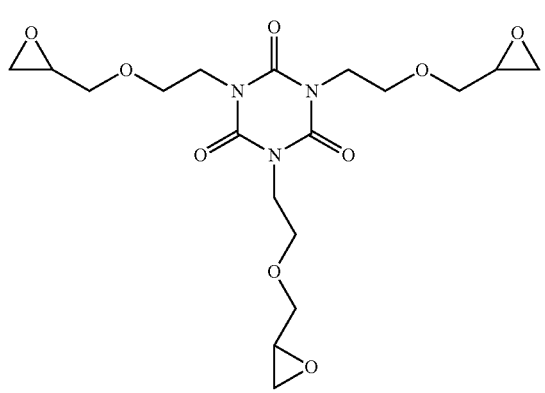
Formula (1-5)
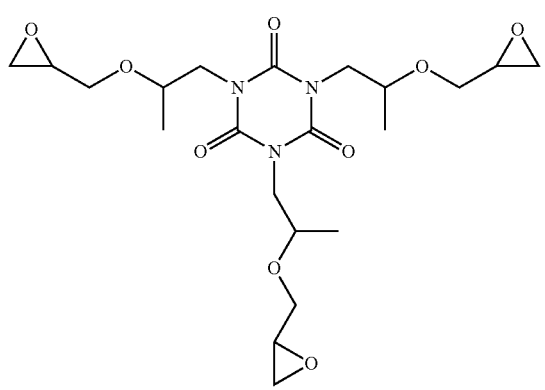
Formula (1-6)
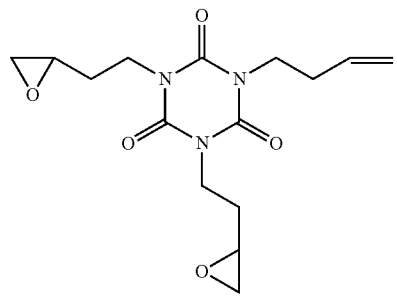
Formula (1-7)
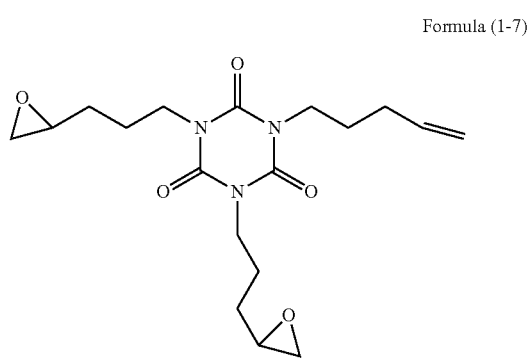
Formula (1-8)
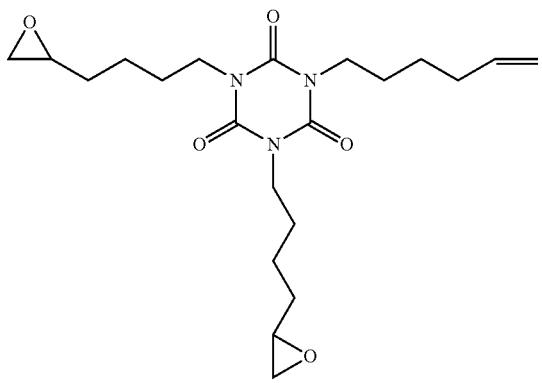
Formula (1-9)
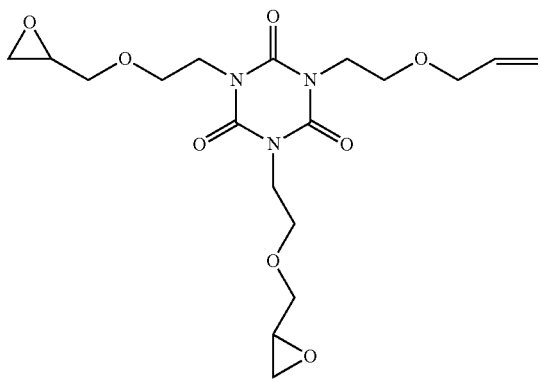

Formula (1-10)
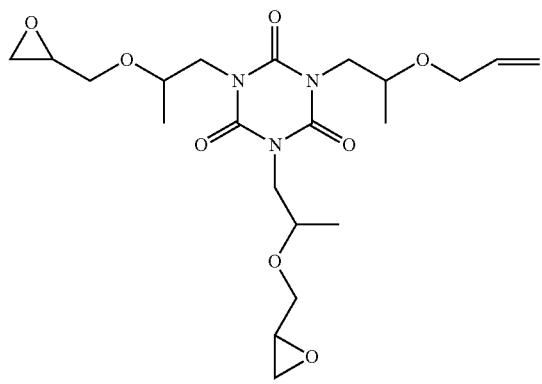
Formula (1-11)
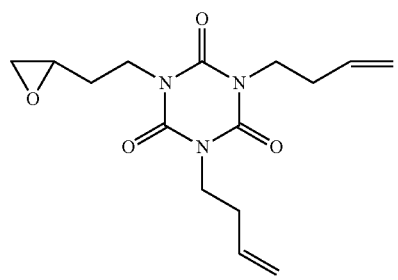
Formula (1-12)
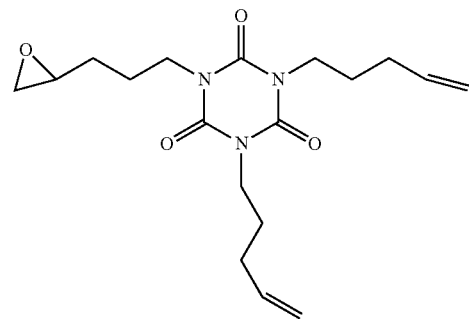
Formula (1-13)
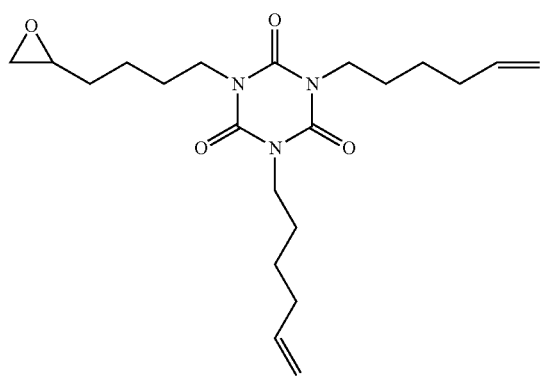
Formula (1-14)
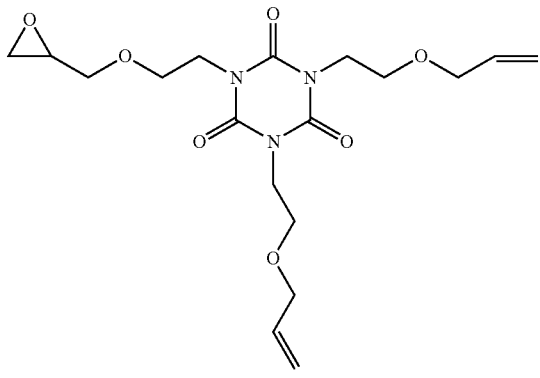
Formula (1-15)
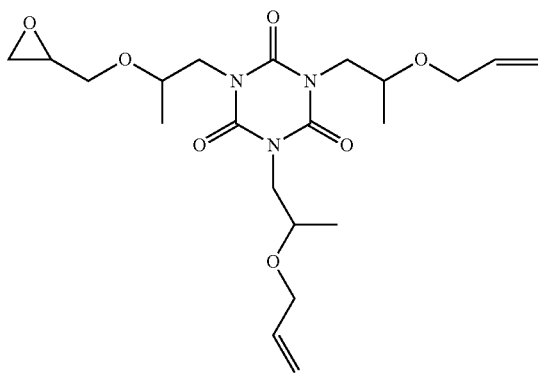
Formula (1-16)
Formula (1-17)
Formula (1-18)
Formula (1-19)
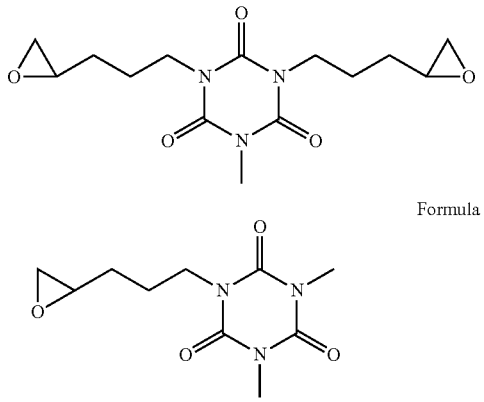

Formula (1-20)

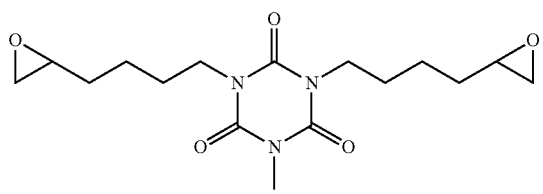

Formula (1-21)

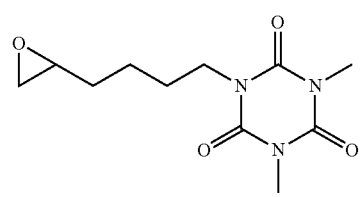

In one embodiment, the epoxy compound represented by Formula (1), for example, the compound represented by Formula (1-2), may be obtained by the process below:

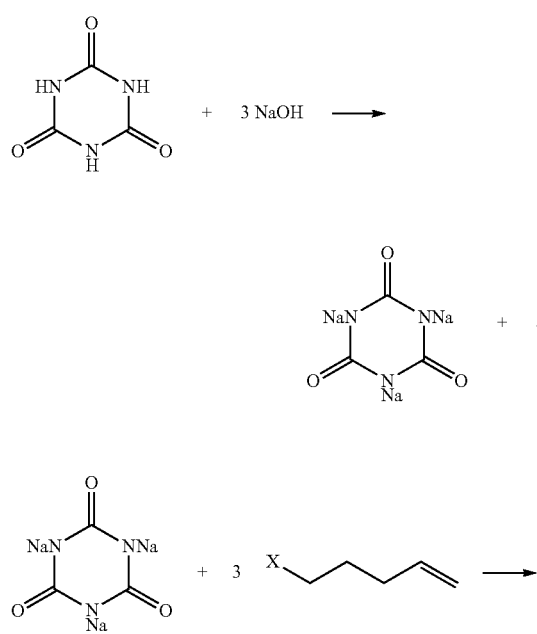

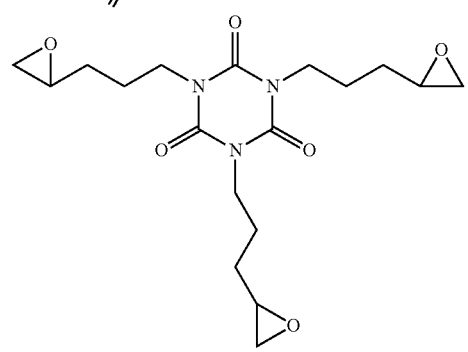

In the above reaction, isocyanuric acid is converted to an isocyanuric acid Na salt using sodium hydroxide. This reaction may be carried out in water at 0 to 100° C. for 1 to 10 hours. Furthermore, the isocyanuric acid Na salt and a halogenated alkene undergo a reaction to yield an alkene-substituted isocyanuric acid. This reaction may be carried out, for example, in a DMF (dimethylformamide) solvent at 0 to 150° C. for 1 to 10 hours. In the Formula, X is a halogen atom, and a monobromoalkene or a monochloroalkene may be used as the halogenated alkene. The alkene-substituted isocyanuric acid may be oxidized with a peracid to yield an epoxy compound. Examples of the peracid are m-chloroperoxybenzoic acid, peracetic acid, hydrogen peroxide-tungstate or the like. This reaction may be carried out in a solvent such as methylene chloride and toluene at 0 to 110° C. for 1 to 10 hours. The compounds represented by Formulae (1-1), (1-3), (1-6) to (1-8) and (1-11) to (1-13) may also be synthesized by the same process.

In other embodiment of the invention, the epoxy compound represented by Formula (1), for example, the compound represented by Formula (1-4), may be obtained by the process below in the case of:

Formula (1-4)

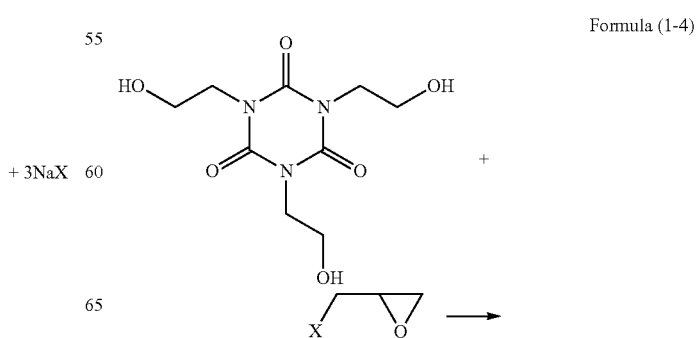

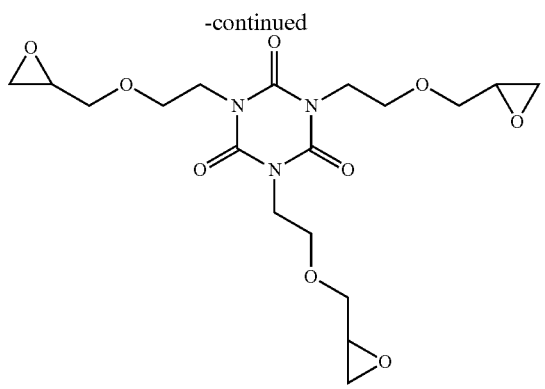

In the above reaction, a hydroxyalkyl isocyanurate and epihalohydrin undergo a reaction to yield tris(alkyle-neoxyglycidyl)isocyantlrate. Examples of the hydroxyalkyl isocyanurate include hydroxyethyl isocyanurate or the like, and examples of the epihalohydrin include epichorohydrin, epibromohydrin, and the like. The reaction is carried out in a solvent such as dioxane using $BF_3$ or tin chloride as a catalyst at 0 to 100° C. for 1 to 10 hours. The compounds represented by Formulae (1-5), (1-9), (1-10), (1-14) and (1-15) can also be synthesized by the same process.

Methyl or alkenyl-substituted isocyantiric acids as precursors of the compounds represented by Formulae (1-16) to (1-21) are obtained as mixtures with trialkenyl-substituted isocyanuric acids by the reaction of isocyanuric acid with a halogenated alkene. This reaction can be carried out, for example, in the presence of potassium carbonate in N,N-dimethylimidazolidinone at 0 to 150° C. for 1 to 20 hours. Besides, potassium hydrogen carbonate, sodium carbonate and sodium hydrogen carbonate may be used as an inorganic base. The precursor is obtained by reacting a part of the methyl of the N,N-dimethylimidazolidinone with isocyanuric acid.

Then, the methyl or alkenyl-substituted isocyanuric acid may be oxidized with a peracid to yield an epoxy compound. M-chloroperoxybenzoic acid, peracetic acid, hydrogen peroxide-tungstate, or the like may be used as the peracid. This reaction may be carried out in a solvent such as methylene chloride and toluene at 0 to 110° C. for 1 to 20 hours.

The compound (b-1-2) having at least one carboxylic acid group and at least one ethylenically unsaturated group may be the same to the aforementioned compound (a-2) having at least one carboxylic acid group and at least one ethylenically unsaturated group and is not repeated again.

During the preparation of the first compound (B-1) having the ethylenically unsaturated group, the reaction solution is usually added with an alkaline compound as a reaction catalyst for accelerating the reaction. Examples of the reaction catalyst include but are not limited to triphenyl phosphine, triphenyl stibine, triethylamine, triethanolamine, tetramethylammonium chloride, benzyltriethylammonium chloride or the like. Based on 100 parts by weight of the total used amount of the epoxy compound (b-1-1) represented by Formula (1) and the compound (b-1-2) having at least one carboxyl group and at least one ethylenically unsaturated group, the used amount of the reaction catalyst is from 0.01 part by weight to 10 parts by weight, and preferably 0.3 parts by weight to 5 parts by weight.

In addition, for the purpose of controlling the polymerization degree, a polymerization inhibitor is usually added into the reaction solution. Examples of the aforementioned polymerization inhibitor include but are not limited to methoxyphenol, methylhydroquinone, hydroquinone, 2,6-di-t-butyl-p-cresol, phenothiazine or the like. The polymerization inhibitor may be used alone or in combinations of two or more. Based on 100 parts by weight of the total used amount of the epoxy compound (b-1-1) represented by Formula (1) and the compound (b-1-2) having at least one carboxyl group and at least one ethylenically unsaturated group, the used amount of the polymerization inhibitor is from 0.01 part by weight to 10 parts by weight, and preferably 0.1 part by weight to 5 parts by weight.

During the preparation of the first compound (B-1) having the ethylenically unsaturated group, a reaction solvent may be used if necessary. Examples of the reaction solvent include but are not limited to alcohol compounds such as ethanol, propanol, isopropanol, butanol, isobutanol, 2-butanol, hexanol or ethylene glycol; ketone compounds such as methyl ethyl ketone or cyclohexanone; aromatic hydrocarbon compounds such as toluene or xylene; cellosolve compounds such as cellosolve or butyl cellosolve; carbitol compounds such as carbitol or butyl carbitol; propylene glycol alkyl ether compounds such as propylene glycol monomethyl ether; poly(propylene glycol) alkyl ether compounds such as di(propylene glycol) methyl ether, acetate ester compounds such as ethyl acetate, butyl acetate, ethylene glycol monoethyl ether acetate, propylene glycol methyl ether acetate and the like; alkyl lactate compounds such as ethyl lactate or butyl lactate; or dialkyl glycol ethers. The aforementioned polymerization solvent may be used alone or in combinations of two or more.

In addition, the reaction is operated at a temperature of 50° C. to 130° C. for a period of 2 hours to 20 hours.

Based on 100 parts by weight of the used amount of the alkali-soluble resin (A), the used amount of the first compound (B-1) having the ethylenically unsaturated group is from 3 parts by weight to 60 parts by weight, preferably from 5 parts by weight to 50 parts by weight, and more preferably from 10 parts by weight to 40 parts by weight. If the first compound (B-1) having the ethylenically unsaturated group is absent, the photosensitive resin composition for a color filter has poor linearity of pattern with high finesse.

In one embodiment, the compound (B) containing the ethylenically unsaturated group comprises a second compound (B-2) having an ethylenically unsaturated group represented by Formula (4):

Formula (4)

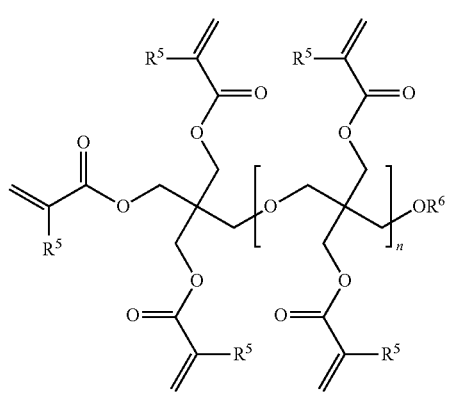

in Formula (4):
R⁵ represents a hydrogen atom or a methyl group;
R⁶ represents a hydrogen atom, an acryloyl group or a methyl acryloyl group; and
n represents an integer of 2 to 3.

Examples of the second compound (B-2) having the ethylenically unsaturated group include but are not limited to tripentaerythritol octa(meth)acrylate, tripentaerythritol hepta(meth)acrylate, tetrapentaerythritol nona(meth)acrylate, tetrapentaerythritol deca(meth)acrylate or the combinations thereof.

Based on 100 parts by weight of the used amount of the alkali-soluble resin (A), the used amount of the second compound (B-2) having the ethylenically unsaturated group is from 20 parts by weight to 200 parts by weight, preferably from 30 parts by weight to 150 parts by weight, and more preferably from 40 parts by weight to 100 parts by weight. If the photosensitive resin composition comprises the second compound (B-2) having the ethylenically unsaturated group, the photosensitive resin composition for a color filter has good developing-resistance.

In other embodiment, the compound (B) may further comprise a third compound (B-3) having an ethylenically unsaturated group, and the third compound (B-3) having the ethylenically unsaturated group is selected from a compound having one ethylenically unsaturated group or a compound having two or more than two ethylenically unsaturated groups.

Examples of the compound having one ethylenically unsaturated group include but are not limited to, acrylamide, (meth) acryloylmorpholine, 7-amino-3,7-dimethyloctyl (meth)acrylate, iso-butoxymethyl (meth)acrylamide, iso-bornyloxyethyl (meth)acrylate, iso-bornyl (meth)acrylate, 2-ethylhexyl (meth)acrylate, ethyl diethylene glycol (meth)acrylate, t-octyl (meth)acrylamide, diacetone (meth)acrylamide, dimethylaminoethyl (meth)acrylate, dodecyl (meth)acrylate, dicyclopentenyloxyethyl (meth)acrylate, dicyclopentenyl (meth)acrylate, N,N-dimethyl (meth)acrylamide, tetrachlorophenyl (meth)acrylate, 2-tetrachlorophenoxy ethyl (meth)acrylate, tetrahydrofurfuryl (meth)acrylate, tetrabromophenyl (meth)acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth)acrylate, vinyl-caprolactam, N-vinylpyrrolidone, phenoxyethyl (meth)acrylate, pentachlorophenyl (meth)acrylate, pentabromophenyl (meth)acrylate, polyethylene glycol mono(meth)acrylate, polypropylene glycol mono(meth)acrylate, bornyl (meth)acrylate, or the like. The aforementioned the compound having one ethylenically unsaturated group may be used alone or in combinations of two or more.

Examples of the compound having two or more ethylenically unsaturated groups include but are not limited to ethylene glycol di(meth)acrylate, dicyclopentenyl di(meth)acrylate, triethylene glycol diacrylate, tetraethylene glycol di(meth)acrylate, tri(2-hydroxyethyl) isocyanate di(meth)acrylate, tri(2-hydroxyethyl) isocyanate tri(meth)acrylate, caprolactone-modified tri(2-hydroxyethyl) isocyanate tri (meth)acrylate, trimethylolpropyl tri(meth)acrylate, ethylene oxide (hereinafter abbreviated as EU) modified trimethylolpropyl tri(meth)acrylate, propylene oxide (hereinafter abbreviated as PO) modified trimethylolpropyl tri(meth) acrylate, tripropylene glycol di(meth)acrylate, neo-pentyl glycol di(meth)acrylate, 1,4-butanediol di(meth)acrylate, 1,6-hexanediol di(meth)acrylate, pentaerythritol tri(meth)acrylate, pentaerythritol tetra(meth)acrylate, polyester di(meth)acrylate, polyethylene glycol di(meth)acrylate, dipentaerythritol hexa(meth)acrylate, dipentaerythritol penta(meth)acrylate, dipentaerythritol tetra(meth)acrylate, caprolactone-modified dipentaerythritol hexa(meth)acrylate, caprolactone-modified dipentaerythritol penta(meth) acrylate, ditrimethylolpropyl tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO-modified glycerol triacrylate, EO-modified bisphenol F di(meth)acrylate, phenol novolac polyglycidyl ether (meth)acrylate, or the like. The aforementioned the compound having two or more ethylenically unsaturated groups may be used alone or in combinations of two or more.

Examples of the third compound (B-3) having the ethylenically unsaturated group include but are not limited to trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, PO-modified glycerol triacrylate or combinations thereof.

The third compound (B-3) having the ethylenically unsaturated group preferably is dipentaerythritol hexaacrylate, trimethylolpropyl triacrylate, ditrimethylolpropyl tetraacrylate or combinations thereof.

Based on 100 parts by weight of the used amount of the alkali-soluble resin (A), the used amount of the third compound (B-3) having the ethylenically unsaturated group is from 7 parts by weight to 280 parts by weight, preferably from 20 parts by weight to 240 parts by weight, and more preferably from 40 parts by weight to 200 parts by weight.

Based on 100 parts by weight of the used amount of the alkali-soluble resin (A), the used amount of the compound (B) containing the ethylenically unsaturated group is from 30 parts by weight to 300 parts by weight, preferably from 40 parts by weight to 250 parts by weight, and more preferably from 50 parts by weight to 200 parts by weight.

The photoinitiator (C) according to the invention may be a free radical photoinitiator, and examples of the photoinitiator (C) include but are not limited to a O-acyloxime compound, a triazine compound, an acetophenone compound, a biimidazole compound, a benzophenone compound or the like.

Examples of the O-oxime compound are 1-[4-(phenylthio)phenyl]-heptane-1,2-dione 2-(O-benzoyloxime), 1-[4-(phenylthio)phenyl]-octane-1,2-dione 2-(O-benzoyloxime), 1-[4-(benzoyl)phenyl]-heptane-1,2-dione 2-(O-benzoyloxime), 1-[9-ethyl-6-(2-methylbenzoyl)-9H-carbazol-3-yl]-ethylketo-1-(O-acetyloxime), 1-[9-ethyl-6-(3-methylbenzoyl)-9H-carbazol-3-yl]-ethylketo-1-(O-acetyloxime), 1-[9-ethyl-6-benzoyl-9H-carbazol-3-yl]-ethylketo-1-(O-acetyloxime), ethylketo-1-[9-ethyl-6-(2-methyl-4-(tetrahydrofuran)benzoyl)-9H-carbazol-3-yl]-1-(O-acetyloxime), ethylketo-1-[9-ethyl-6-(2-methyl-5-(tetrahydropyranyl)benzoyl)-9H-carbazol-3-yl]-1-(O-acetyloxime), ethylketo-1-[9-ethyl-6-(2-methyl-4-(tetrahydrofuran)methoxybenzoyl)-9H-carbazol-3-yl]-1-(O-acetyloxime), ethylketo-1-[9-ethyl-6-(2-methyl-5-(tetrahydrofuran)methoxybenzoyl)-9H-carbazol-3-yl]-1-(O-acetyloxime), ethylketo-1-[9-ethyl-6-{2-methyl-4-(2,2-dimethyl-1,3-dioxolan)benzoyl}-9H-carbazol-3-yl]-1-(O-acetyloxime), ethylketo-1-[9-ethyl-6-{2-methyl-4-(2,2- dimethyl-1,3-dioxolan)methoxybenzoyl}-9H-carbazol-3-yl]-1-(O-acetyloxime) or combinations thereof.

Examples of the triazine compound include but are not limited to a 2,4-bis(trichloromethyl)-6-(p-methoxy)styryl-s-triazine, 2,4-bis(trichloromethyl)-6-(1-p-dimethylamino-phenyl-1,3-butadienyl)-s-triazine, 2-trichloromethyl-4-amino-6-(p-methoxy) styryl-s-triazine] or combinations thereof.

Examples of the acetophenone compound include but are not limited to p-dimethylaminoacetophenone, α,α'-dimethoxyazoxyacetophenone, 2,2'-dimethyl-2-phenylacetophenone, p-methoxyacetophenone, 2-methyl-1-(4-methylthiophenyl)-2-morpholino-1-propanone, or 2-benzyl-2-N,N-dimethylamino-1-(4-morpholinophenyl)-1-butanone or combinations thereof.

Examples of the biimidazole compound include but are not limited to 2,2'-bis(o-chlorophenyl)-4,4',5,5'-tetraphenyl-biimidazole, 2,2'-bis(o-fluorophenyl)-4,4',5,5'-tetraphenyl-biimidazole, 2,2'-bis(o-methylphenyl)-4,4',5,5'-tetraphenyl-biimidazole, 2,2'-bis(o-methoxyphenyl)-4,4',5,5'-tetraphenylbiimidazole, 2,2'-bis(o-ethylphenyl)-4,4',5,5'-tetraphenylbiimidazole, 2,2'-bis(p-methoxyphenyl)-4,4',5,5'-tetraphenylbiimidazole, 2,2'-bis(2,2',4,4'-tetramethoxyphenyl)-4,4',5,5'-tetraphenylbiimidazole, 2,2'-bis(2-chlorophenyl)-4,4',5,5'-tetraphenylbiimidazole, or 2,2'-bis(2,4-dichlorophenyl)-4,4',5,5'-tetraphenylbiimidazole or combinations thereof.

Examples of the benzophenone compound include but are not limited to thioxanthone, 2,4-diethylthioxanthone, thioxanthone-4-sulfone, benzophenone, 4,4'-bis(dimethylamino)benzophenone, 4,4'-bis(diethylamino)benzophenone or combinations thereof.

Preferably, the photoinitiator (C) is 2-methyl-1-(4-methylthiophenyl)-2-morpholino-1-propanone, 1-[4-(phenylthio)phenyl]-octane-1,2-dione 2-(O-benzoyloxime), 1-[9-ethyl-6-(2-methylbenzoyl)-9H-carbazol-3-yl]-ethylketo-1-(O-acetyloxime), ethylketo-1-[9-ethyl-6-(2-methyl-4-tetrahydrofurylmethoxybenzoyl)-9H-carbazol-3-yl]-1-(O-acetyloxime), ethylketo-1-[9-ethyl-6-{2-methyl-4-(2,2-dimethyl-1,3-dioxolyl)methoxybenzoyl}-9H-carbazol-3-yl]-1-(O-acetyloxime), 2,4-bis(trichloromethyl)-6-(p-methoxy)styryl-s-triazine, 2-benzyl-2-N,N-dimethylamino-1-(4-morpholinophenyl)-1-butanone, 2,2'-bis(2,4-dichlorophenyl)-4,4',5,5'-tetraphenylbiimidazole, or 4,4'-bis (diethylamino)benzophenone or combinations thereof.

The photoinitiator (C) may be used alone or in combinations of two or more.

Based on 100 parts by weight of the used amount of the alkali-soluble resin (A), the used amount of the photoinitiator (C) is from 10 parts by weight to 100 parts by weight, preferably from 15 parts by weight to 90 parts by weight, and more preferably from 20 parts by weight to 80 parts by weight.

Besides, without affecting the physical properties, the photosensitive resin composition further comprises other initiators except from the photoinitiator (C) as mentioned above if necessary. Examples of the other initiators include but are not limited to an α-diketone compound, an acyloin compound, an acyloin ether compound, an acylphosphineoxide compound, a quinine compound, a halide compound, a peroxide compound, or the like.

Examples of the α-diketone compound include but are not limited to a benzil compound, an acetyl compound or the like.

Examples of the acyloin compound include but are not limited to benzoin or the like.

Examples of the acyloin ether compound include but are limited to benzoin methylether, benzoin ethylether, benzoin isopropyl ether or the like.

Examples of the acylphosphine oxide compound include but are not limited to 2,4,6-trimethylbenzoyl diphenylphosphine oxide, bis-(2,6-dimethoxybenzoyl)-2,4,4-trimethyl benzyl phosphine oxide or the like.

Examples of the quinone compound include but are not limited to anthraquinone, 1,4-naphthoquinone or the like.

Examples of the halide compound include but are not limited to phenacyl chloride, tribromomethyl phenylsulfone, tris(trichloromethyl)-s-triazine or the like.

Examples of the peroxide compound include but are not limited to di-tert-butyl peroxide or the like.

The pigment (D) according to the invention is an inorganic pigment, organic pigment or combinations thereof. The inorganic pigment may be metal compounds such as metal oxides, metal complex salt compounds or the like. The metal oxide may be an oxide of iron, cobalt, aluminum, cadmium, lead, copper, titanium, magnesium, chromium, zinc, antimony or the like or a composite oxide of the aforementioned metal.

The aforementioned organic pigment is selected from C.I. Pigment Yellow 1, 3, 11, 12, 13, 14, 15, 16, 17, 20, 24, 31, 53, 55, 60, 61, 65, 71, 73, 74, 81, 83, 93, 95, 97, 98, 99, 100, 101, 104, 106, 108, 109, 110, 113, 114, 116, 117, 119, 120, 126, 127, 128, 129, 138, 139, 150, 151, 152, 153, 154, 155, 156, 166, 167, 168, 175; C.I. Pigment Orange 1, 5, 13, 14, 16, 17, 24, 34, 36, 38, 40, 43, 46, 49, 51, 61, 63, 64, 71, 73; C.I. Pigment Red 1, 2, 3, 4, 5, 6, 7, 8, 9, 10, 11, 12, 14, 15, 16, 17, 18, 19, 21, 22, 23, 30, 31, 32, 37, 38, 40, 41, 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187, 188, 190, 193, 194, 202, 206, 207, 208, 209, 215, 216, 220, 224, 226, 242, 243, 245, 254, 255, 264, 265; C.I. Pigment Purple 1, 19, 23, 29, 32, 36, 38, 39; C.I. Pigment Blue 1, 2, 15, 15:3, 15:4, 15:6, 16, 22, 60, 66; C.I. Pigment Green 7, 36, 37: C.I. Pigment Brown 23, 25, 28; or Pigment Black 1, 7. The pigment (D) may be used alone or in combinations of two or more.

Based on 100 parts by weight of the used amount of the alkali-soluble resin (A), the used amount of the pigment (D) is from 40 parts by weight to 400 parts by weight, preferably 50 parts by weight to 350 parts by weight, and more preferably 60 parts by weight to 300 parts by weight.

In one embodiment of the invention, an average particle size of primary particle of the pigment (D) is 10 nm to 200 nm, preferably 20 nm to 150 nm, and more preferably 30 nm to 130 nm.

When necessary, the pigment (D) optionally includes a dispersant, for example, a cationic dispersant, an anionic dispersant, a nonionic dispersant, a zwitterionic dispersant, a polysiloxane dispersant, or a fluoro surfactant.

The surfactant includes but is not limited to polyepoxyethane alkyl ethers such as polyepoxyethane lauryl ether, polyepoxyethane stearyl ether or polyepoxyethane oleyl ether; polyepoxyethane alkyl phenyl ethers such as polyepoxyethane octyl phenyl ether or polyepoxyethane nonyl phenyl ether; polyethylene glycol diesters such as polyethylene glycol dilaurate and polyethylene glycol distearate; sorbitol anhydride fatty acid esters; fatty acid-modified polyesters; and tertiary amine-modified polyurethanes. Specific examples of the surfactant are KP (manufactured by Shin-Etsu Chemical Co., Ltd.), SF-8427 (manufactured by Toray Dow Corning Silicone Co., Ltd.), Polyflow (manufactured by Kyoeisha Oil Chemical Co., Ltd.), F-Top (manufactured by Tochem Product Co., Ltd.), Megafac (manufactured by Dainippon Ink and Chemicals (DIC) Co., Ltd.), Fluorade (manufactured by Sumitomo 3M, Ltd.), Asahi Guard or Surflon (manufactured by Asahi glass Co., Ltd.).

The organic solvent (E) according to the invention is able to dissolve the alkali-soluble resin (A), the compound (B) containing the ethylenically unsaturated group, the photoinitiator (C), the pigment (D) and the dye (F), without interacting with the components described above, and has a suitable volatility.

In addition, the organic solvent (E) may be the same as the organic solvent used in preparation of the second alkali-soluble resin (A-2) and are not repeated again. Preferably, the organic solvent (E) is propylene glycol monomethyl ether acetate, ethyl 3-ethoxypropionate or combinations thereof.

Based on 100 parts by weight of the used amount of the alkali-soluble resin (A), the used amount of the organic solvent (E) is from 500 parts by weight to 5000 parts by weight, preferably 800 parts by weight to 4500 parts by weight, and more preferably 1000 parts by weight to 4000 parts by weight.

In one preferred embodiment of the invention, the photosensitive resin composition for the color filter according to the invention further comprises a dye (F). The dye (F) according to the present invention may be used with the use of the pigment (D). The dye (F) with a specific spectrum can be chosen by skilled artisans in this field. In the embodiment of the invention, the dye (F) is azo dyes, azo-metal complex dyes, anthraquinone dyes, indigo dyes, thioindigo dyes, phthalocyanine dyes, diphenylmethane dyes, triphenylmethane dyes, xanthene dyes, thiazine dyes, cationic dyes, cyanine dyes, nitro dyes, quinoline dyes, naphthoquinone dyes, oxazine dyes, or the like.

In one embodiment of the invention, a red dye is C.I. Acid Red 1, 2, 3, 4, 5, 6, 7, 8, 9, 10, 11, 12, 13, 14, 15, 16, 17, 18, 19, 20, 22, 23, 24, 25, 25:1, 26, 26:1, 26:2, 27, 29, 30, 31, 32, 33, 34, 35, 36, 37, 39, 40, 41, 42, 43, 44, 45, 47, 50, 52, 53, 54, 55, 56, 57, 59, 60, 62, 64, 65, 66, 67, 68, 70, 71, 73, 74, 76, 76:1, 80, 81, 82, 83, 85, 86, 87, 88, 89, 91, 92, 93, 97, 99, 102, 104, 106, 107, 108, 110, 111, 113, 114, 115, 116, 120, 123, 125, 127, 128, 131, 132, 133, 134, 135, 137, 138, 141, 142, 143, 144, 148, 150, 151, 152, 154, 155, 157, 158, 160, 161, 163, 164, 167, 170, 171, 172, 173, 175, 176, 177, 181, 229, 231, 237, 239, 240, 241, 242, 249, 252, 253, 255, 257, 260, 263, 264, 266, 267, 274, 276, 280, 286, 289, 299, 306, 309, 311, 323, 333, 324, 325, 326, 334, 335, 336, 337, 340, 343, 344, 347, 348, 350, 351, 353, 354, 356, 388 or the like; and C.I. Direct Red 1, 2, 2:1, 4, 5, 6, 7, 8, 10, 10:1, 13, 14, 15, 16, 17, 18, 21, 22, 23, 24, 26, 26:1, 28, 29, 31, 33, 33:1, 34, 35, 36, 37, 39, 42, 43, 43:1, 44, 46, 49, 52, 53, 54, 55, 56, 57, 58, 59, 60, 61, 62, 67, 67:1, 68, 72, 72:1, 73, 74, 75, 77, 78, 79, 81, 81:1, 85, 86, 88, 89, 90, 97, 100, 101, 101:1, 107, 108, 110, 114, 116, 117, 120, 121, 122, 122:1, 124, 125, 127, 127:1, 127:2, 128, 129, 130, 132, 134, 135, 136, 137, 138, 140, 141, 148, 149, 150, 152, 153, 154, 155, 156, 169, 171, 172, 173, 174, 175, 176, 177, 179, 180, 181, 182, 185, 186, 189, 204, 211, 213, 214, 217, 222, 224, 225, 226, 227, 228, 232, 236, 237, 238 or the like.

In one embodiment of the invention, a yellow dye is C.I. Acid Yellow 2, 3, 4, 5, 6, 7, 8, 9, 9:1, 10, 11, 11:1, 12, 13, 14, 15, 16, 17, 17:1, 18, 20, 21, 22, 23, 25, 26, 27, 29, 30, 31, 33, 34, 36, 38, 39, 40, 40:1, 41, 42, 42:1, 43, 44, 46, 48, 51, 53, 55, 56, 60, 63, 65, 66, 67, 68, 69, 72, 76, 82, 83, 84, 86, 87, 90, 94, 105, 115, 117, 122, 127, 131, 132, 136, 141, 142, 143, 144, 145, 146, 149, 153, 159, 166, 168, 169, 172, 174, 175, 178, 180, 183, 187, 188, 189, 190, 191, 192, 199 or the like; and C.I. Direct Yellow 1, 2, 4, 5, 12, 13, 15, 20, 24, 25, 26, 32, 33, 34, 35, 41, 42, 44, 44:1, 45, 46, 48, 49, 50, 51, 61, 66, 67, 69, 70, 71, 72, 73, 74, 81, 84, 86, 90, 91, 92, 95, 107, 110, 117, 118, 119, 120, 121, 126, 127, 129, 132, 133, 134 or the like.

In one embodiment of the invention, an orange dye is C.I. Acid Orange 1, 1:1, 4, 5, 6, 7, 8, 9, 10, 12, 14, 16, 17, 18, 19, 20, 20:1, 22, 23, 24, 24:1, 25, 27, 28, 28:1, 30, 31, 33, 35, 36, 37, 38, 41, 45, 49, 50, 51, 54, 55, 56, 59, 79, 83, 94, 95, 102, 106, 116, 117, 119, 128, 131, 132, 134, 136, 138.

C.I. Direct Orange 1, 2, 3, 4, 5, 6, 7, 8, 10, 13, 17, 19, 20, 21, 24, 25, 26, 29, 29:1, 30, 31, 32, 33, 43, 49, 51, 56, 59, 69, 72, 73, 74, 75, 76, 79, 80, 83, 84, 85, 87, 88, 90, 91, 92, 95, 96, 97, 98, 101, 102, 102:1, 104, 108, 112, 114 or the like.

In one embodiment of the invention, a blue dye is C.I. Acid Blue 1, 2, 3, 4, 5, 6, 7, 8, 9, 11, 13, 14, 15, 17, 19, 21, 22, 23, 24, 25, 26, 27, 29, 34, 35, 37, 40, 41, 41:1, 43, 44, 45, 46, 47, 48, 49, 50, 51, 52, 53, 54, 55, 56, 57, 58, 62, 62:1, 63, 64, 65, 68, 69, 70, 73, 75, 78, 79, 80, 81, 83, 84, 85, 86, 88, 89, 90, 90:1, 91, 92, 93, 95, 96, 99, 100, 103, 104, 108, 109, 110, 111, 112, 113, 114, 116, 117, 118, 119, 120, 123, 124, 127, 127:1, 128, 129, 135, 137, 138, 143, 145, 147, 150, 155, 159, 169, 174, 175, 176, 183, 198, 203, 204, 205, 206, 208, 213, 227, 230, 231, 232, 233, 235, 239, 245, 247, 253, 257, 258, 260, 261, 262, 264, 266, 269, 271, 272, 273, 274, 277, 278, 280 or the like; and C.I. Direct Blue 1, 2, 3, 4, 6, 7, 8, 8:1, 9, 10, 12, 14, 15, 16, 19, 20, 21, 21:1, 22, 23, 25, 27, 29, 31, 35, 36, 37, 40, 42, 45, 48, 49, 50, 53, 54, 55, 58, 60, 61, 64, 65, 67, 79, 96, 97, 98:1, 101, 106, 107, 108, 109, 111, 116, 122, 123, 124, 128, 129, 130, 130:1, 132, 136, 138, 140, 145, 146, 149, 152, 153, 154, 156, 158, 158:1, 164, 165, 166, 167, 168, 169, 170, 174, 177, 181, 184, 185, 188, 190, 192, 193, 206, 207, 209, 213, 215, 225, 226, 229, 230, 231, 242, 243, 244, 253, 254, 260, 263 or the like.

In one embodiment of the invention, a purple dye is C.I. Acid Purple 1, 2, 3, 4, 5, 5:1, 6, 7, 7:1, 9, 11, 12, 13, 14, 15, 16, 17, 19, 20, 21, 23, 24, 25, 27, 29, 30, 31, 33, 34, 36, 38, 39, 41, 42, 43, 47, 49, 51, 63, 67, 72, 76, 96, 97, 102, 106, 109 or the like; and C.I. Direct Purple 1, 3, 4, 5, 6, 7, 8, 9, 10, 11, 12, 13, 14, 16, 17, 18, 21, 22, 25, 26, 27, 28, 29, 30, 31, 32, 34, 35, 36, 37, 38, 39, 40, 41, 42, 43, 45, 51, 52, 54, 57, 58, 61, 62, 63, 64, 71, 72, 77, 78, 79, 80, 81, 82, 83, 85, 86, 87, 88, 93, 97 or the like.

In one embodiment of the invention, a green dye is C.I. Acid Green 2, 3, 5, 6, 7, 8, 9, 10, 11, 13, 14, 15, 16, 17, 18, 19, 20, 22, 25, 25:1, 27, 34, 36, 37, 38, 40, 41, 42, 44, 54, 55, 59, 66, 69, 70, 71, 81, 84, 94, 95 or the like; and C.I. Direct Green 11, 13, 14, 24, 30, 34, 38, 42, 49, 55, 56, 57, 60, 78, 79, 80 or the like.

Based on 100 parts by weight of the used amount of the alkali-soluble resin (A), the used amount of the dye (F) is from 0.1 part by weight to 10 parts by weight, preferably 0.5 parts by weight to 8 parts by weight, more preferably 1 part by weight to 6 parts by weight.

Without affecting the physical properties, the photosensitive resin composition further comprises an additives (G). Examples of the additives (G) include but are not limited to fillers, polymers other than the alkali-soluble resin (A), adhesion-promoting agents, antioxidants, UV absorbents, anti-coagulants or the like.

Examples of the fillers include but are not limited to glass, aluminum or the like.

Examples of the polymers other than the alkali-soluble resin (A) include but are not limited to polyvinyl alcohol, polyethylene glycol monoalkyl ether, polyfluoro alkyl acrylate or the like.

Examples of the adhesion-promoting agents include but are not limited to vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidyloxypropyltrimethoxysilane, 3-glycidyloxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryl oxypropyltrimethoxysilane, 3-mercaptopropyltrimethoxysilane or the like.

Examples of the antioxidants include but are not limited to 2,2-thiobis(4-methyl-6-t-butylphenol), 2,6-di-t-butylphenol, or the like. Examples of the UV absorbents include 2-(3-t-butyl-5-methyl-2-hydroxyphenyl)-5-chlorobenzotriazole, alkoxybenzophenone or the like.

Examples of the anti-coagulants include sodium polyacrylate or the like.

Based on 100 parts by weight of the used amount of the alkali-soluble resin (A), the used amount of the additives (G) is from 0.1 part by weight to 10 parts by weight; preferably 0.5 parts by weight to 9 parts by weight; more preferably 1 part by weight to 8 parts by weight.

The present invention also provides a method for manufacturing a color filter comprising forming a pixel layer with the photosensitive resin composition as mentioned above.

The present invention also provides a color filter manufactured by the method as mentioned above.

Preferably, the color filter comprises a pixel layer and the pixel layer is formed by the photosensitive resin composition.

The formation method of the color filter according to the invention may be performed by coating the photosensitive composition for a color filter, which is mixed into a solution state, on a substrate by a coating method such as spin-coating, cast coating, or roll coating, wherein the black matrix for separating each pixel color layer is formed on the substrate in advance by using the photosensitive resin composition. After coating, most of the solvent is removed by a method of reduced pressure drying, and then the solvent is removed by pre-baking to form a pre-baked coating film. The aforementioned conditions of the reduced pressure drying and pre-bake may be specified based on the type and the mix ratio of each ingredient. Generally, the reduced pressure drying may be performed at a pressure of 0 mmHg to 200 mmHg for 1 second to 60 seconds, and the pre-bake may be performed at a temperature of 70° C. to 110° C. for 1 minute to 15 minutes. After the pre-bake, the coating film is exposed by a specified mask, and the unnecessary portion is removed by immersing and developing the exposed coating film in a developing solution at a temperature of 23±2° C. for 15 seconds to 5 minutes to form a specific pattern. The light used in the exposure step is preferably an ultraviolet light such as a g-line, a h-line, or an i-line, and the ultra-violet irradiation device may be, for instance, a(n) (ultra-)high pressure mercury vapor lamp or a metal halide lamp.

The substrate used to form the color filter is made from bare glass, soda glass, Pyrex glass, silica glass, or any one of these glass coated with a transparent conductive film, or a transparent electrode substrate (such as a Si substrate) used in solid state image pick up devices. Before coating the photosensitive resin composition on the substrate, a black matrix is formed on the substrate to separate each color pixel element.

Examples of the developer solution is an alkali aqueous solution such as sodium hydroxide, potassium hydroxide, sodium carbonate, sodium hydrogencarbonate, potassium carbonate, potassium hydrogencarbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, 1,8-diaza-bicyclo(5,4,0)-7-undecene, or the like. The concentration of the developer in the solution is from 0.001 wt % to 10 wt %, preferably from 0.005 wt % to 5 wt %, and more preferably from 0.01 wt % to 1 wt %.

Thereafter, the patterns on the substrate are washed by water, and then dried by using compressed air or nitrogen gas.

After the coating film on the substrate is dried, the volatile components in the coating film is removed at 100° C. to 280° C. for 1 to 15 minutes with a hot plate or an oven, and the unreacted ethylenically unsaturated double bonds in the coating film are cured under thermosetting. The cured pixel color layers such as red, green, blue and the like may be formed by applying the colored photosensitive composition such as red, green, blue on the pixel by repeating the aforementioned steps.

Furthermore, an indium tin oxide (ITO) vapor deposition film is formed on the pixel layer under a vacuum environment of a temperature of 220° C. to 250° C. When necessary, the ITO film is further coated with polyimideimine for liquid crystal alignment membrane after etching and wiring, thereby firing, a color filter for a liquid crystal display device is obtained.

The present invention provides a liquid crystal display element comprising the color filter as mentioned above.

The liquid crystal display element according to the invention may be formed by the following method: the color filter substrate formed by the preparation method of the color filter and a driving substrate with a thin film transistor (TFT) are placed opposite to each other with a gap (cell gap) between the two, and then the surrounding area of the two substrates is laminated with a sealing agent. Next, a liquid crystal is injected into the gap separated by the surface of the substrates and the sealing agent to seal the injection hole and to form a liquid crystal cell. Then, a polarizer is laminated to the outer surface of the liquid crystal cell, i.e. the other side surfaces of each of the substrates forming the liquid crystal cell so as to fabricate the liquid crystal display element.

The following examples are given for the purpose of illustration only and are not intended to limit the scope of the present invention.

Synthesis of First Alkali-Soluble Resin (A-1)

Synthesis Example A-1-1

A 500 mL four-necked flask was continuously added with 100 parts by weight of a fluorene epoxy compound (Model ESF-300, manufactured by Nippon Steel Chemical Co., epoxy equivalent 231), 30 parts by weight of acrylic acid, 0.3 parts by weight of benzyltriethylammonium chloride, 0.1 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a light yellow and transparent mixture solution having a solid content concentration of 50 wt %.

Next, 100 parts by weight of the mixture solution was dissolved in 25 parts by weight of ethylene glycol ethyl ether acetate, and at the same time, 6 parts by weight of tetrahydrophthalic anhydride and 13 parts by weight of benzophenonetetracarboxylic dianhydride were added, and then the mixture solution was heated to 110° C. to 115° C. and reacted for 2 hours to obtain the first alkali-soluble resin (A-1-1), wherein the first alkali-soluble resin (A-1-1) had an acid value of 98.0 mgKOH/g and a weight average molecular weight was 3150.

Synthesis Example A-1-2

A 500 mL four-necked flask was continuously added with 100 parts by weight of a fluorene epoxy compound (Model ESF-300, manufactured by Nippon Steel Chemical Co., epoxy equivalent 231), 30 parts by weight of acrylic acid, 0.3 parts by weight of benzyltriethylammonium chloride, 0.1 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a light yellow and transparent mixture solution having a solid content concentration of 50 wt %.

Next, 100 parts by weight of the mixture solution was dissolved in 25 parts by weight of ethylene glycol ethyl ether acetate, and at the same time, 13 parts by weight of benzophenone tetracarboxylic dianhydride was added, and then the mixture solution was reacted for 2 hours at 90° C. to 95° C. Then, 6 parts by weight of tetrahydrophthalic anhydride was added, and the mixture solution was reacted for 4 hours at 90° C. to 95° C. to obtain the first alkali-soluble resin (A-1-2), wherein the first alkali-soluble resin (A-1-2) had an acid value of 99.0 mgKOH/g and a weight average molecular weight was 4630.

Synthesis Example A-1-3

A reaction vessel was added with 400 parts by weight of an epoxy compound (Model NC-3000, manufactured by Nippon Kayaku Co. Ltd.; epoxy equivalent 288), 102 parts by weight of acrylic acid, 0.3 parts by weight of methoxyphenol, 5 parts by weight of triphenyl phosphine, and 264 parts by weight of propylene glycol methyl ether acetate, wherein the temperature was maintained at 95° C. and the mixture was reacted for 9 hours to obtain an intermediate product having an acid value of 2.2 mgKOH/g. Then, 151 parts by weight of tetrahydrophthalic anhydride was added and the mixture was reacted for 4 hours at 95° C. to obtain the resin (A-1-3) having an acid value of 102 mgKOH/g and a weight averaged molecular weight of 5,200.

Synthesis of Second Alkali-Soluble Resin (A-2)

Synthesis Example A-2-1

A 1000 ml four-necked flask equipped with a nitrogen inlet, a stirrer, a heater, a condenser and a thermometer was purged with nitrogen, and then 5 parts by weight of 2-methacryloylethoxy succinate (hereinafter as HOMS), 5 parts by weight of dicyclopentenyl acrylate (hereinafter as FA-511A), 40 parts by weight of styrene monomer (hereinafter as SM) and 50 parts by weight of methyl methacrylate (hereinafter as MMA) was dissolved into 200 parts by weight of ethyl 3-ethoxypropionate; wherein the monomers were continuously fed into the reactor.

After mixing uniformly, the temperature of an oil bath was raised to 100° C. Then, 6 parts by weight of 2,2'-azobis-2-methyl butyronitrile (hereinafter as AMBN) was dissolved into ethyl 3-ethoxypropionate, divided equally into five portions, and added into the four-necked flask portion within an hour.

Polymerization was conducted at 100° C. for 6 hours, and a polymerization product was then taken out of the four-necked flask followed by removal of solvent from the product so as to obtain the second alkali-soluble resin (A-2-1).

Synthesis Example A-2-2 to A-2-4

Synthesis Examples A-2-2 to A-2-4 were synthesized with the same method as in Synthesis Example A-2-1 by using various kinds or amounts of the reactants for the second alkali-soluble resin. The formulations of Synthesis Examples A-2-2 to A-2-4 were listed in Table 1 rather than focusing or mentioning them in details. The term "continuously added" refers to monomers for copolymerization that are continuously fed into the reactor and continuously reacting and discharging; and the term "simultaneously added" refers to monomers for copolymerization that are entirely fed into the reactor and after the reaction finished, the reactant is discharged simultaneously.

TABLE 1

| Synthesis Example | Composition (parts by weight) | | | | | | | | | | | Copolymerization Condition | | |
|---|---|---|---|---|---|---|---|---|---|---|---|---|---|---|
| | Monomers for Copolymerization | | | | | | | | | initiator | solvent | Feeding manner | Reac. Temp. (° C.) | Reac. Time (hrs) |
| | a-5 | | | a-6 | | | | | | | | | | |
| | HOMS | MAA | AA | FA-511A | FA-512A | SM | BzMA | MMA | MA | AMBN | EEP | | | |
| A-2-1 | 5 | | | 5 | | 40 | | 50 | | 6 | 200 | continuously | 100 | 6 |
| A-2-2 | | 15 | | | | | 30 | | 55 | 5.5 | 200 | simultaneously | 105 | 6 |
| A-2-3 | | | 25 | | 15 | 20 | | 40 | | 6 | 200 | continuously | 100 | 5.5 |
| A-2-4 | 10 | | 20 | | | | 30 | 40 | | 6 | 200 | simultaneously | 105 | 6 |

HOMS 2-methacryloyloxyethyl succinate monoester
MAA methacrylic acid
AA acrylic acid
FA-511A dicyclopentenyl acrylate
FA-512A dicyclopentenyloxyethyl acrylate
SM styrene monomer
BzMA benzyl methacrylate
MMA methyl methacrylate
MA methacrylate
AMBN 2,2'-azobis-2-methyl butyronitrile
EEP ethyl 3-ethoxypropionate Synthesis of First Compound (B-1) Having the
Ethylenically Unsaturated Group Synthesis Example 1

Preparation of Diallylmonoglycidyl Isocyanurate

A reaction vessel was added with 106 g of isocyanuric acid and 420 ml of water of slurry, and then 206 g of 48% sodium hydroxide solution was dropped into the aforementioned mixture. After the mixture was reacted for 2 hours at 60 to 70° C., water was removed, and the mixture was washed by methanol and then dried to obtain 157.5 g of sodium isocyanurate as white crystal. Then, the reaction vessel equipped with a stirrer and a condenser was added with 400 ml of dimethylformamide as a solvent for reacting 157.5 g of sodium isocyanurate and 290.4 g of 3-bromo-1-propylene for 6 hours at 120 to 125° C., and then an inorganic salt was filtered off. Toluene was extracted out and the reactants were washed with water and dried and the solvent was dried to obtain 154.6 g of triallyl isocyanurate (Mw=249.3) as pale brown oil. 8700 ml of dichloromethane was taken as a solvent, and 154.6 g of triallyl isocyanurate and 267 g of m-chloroperbenzoic acid (not higher than 30° C.) was slowly added into a cooler and stirred and reacted at 25° C. for 4 hours. After completing the reaction, 3000 ml of 10% sodium bisulfite solution was slowly added at 20° C., and then an insoluble material was filtered off. Chloroform was added for extraction, and the reactants were washed thoroughly with 10% sodium bisulfite solution and saturated sodium bicarbonate solution. After drying and distilling the solvent, an epoxy compound was obtained. The aforementioned product was purified with silica gel chromatograph to obtain 111.3 g of transparent oil. The obtained epoxy compound was diallylmonoglycidyl isocyanurate (Mw=265).

Synthesis Example 2

Preparation of Monoallyldiglycidyl Isocyanurate 8700 ml of dichloromethane was taken as a solvent, and 154.6 g of triallyl isocyanurate (Mw=154.6) and 535 g of m-chloroperbenzoic acid (not higher than 30° C.) was slowly added into a cooler and stirred and reacted at 25° C. for 4 hours. After completing the reaction, 3000 ml of 10% sodium bisulfite solution was slowly added at 20° C., and then an insoluble material was filtered off. Chloroform was added for extraction, and the reactants were washed thoroughly with 10% sodium bisulfite solution and saturated sodium bicarbonate solution. After drying and distilling the solvent, an epoxy compound was obtained. The aforementioned product was purified with silica gel chromatograph to obtain 118 g of transparent oil. The obtained epoxy compound was monoallyldiglycidyl isocyanurate (Mw=281).

Synthesis Example 3

Preparation of 1-allyl-3,5-bis (2-methyl-epoxy propyl)isocyanurate

A reaction vessel equipped with a stirrer and a condenser was added with 400 ml of dimethylformamide as a solvent for reacting 157.5 g of sodium isocyanurate, 96.8 g of 3-bromo-1-propylene and 216 g of 3-bromo-2-methyl propene for 6 hours at 120 to 125° C., and then an inorganic salt was filtered off. Toluene was extracted out and the reactants were washed with water and dried and the solvent was dried to obtain 171.7 g of 1-(allyl)-3,5(2-methyl-propenyl) isocyanurate (Mw=277) as pale brown oil. 8700 ml of dichloromethane was taken as a solvent, and 171.7 g of 1-(allyl)-3,5(2-methyl-propenyl) isocyanurate and 535 g of m-chloroperbenzoic acid (not higher than 30° C.) was slowly added into a cooler and stirred and reacted at 25° C. for 4 hours. After completing the reaction, 3000 ml of 10% sodium bisulfite solution was slowly added at 20° C., and then an insoluble material was filtered off. Chloroform was added for extraction, and the reactants were washed thoroughly with 10% sodium bisulfite solution and saturated sodium bicarbonate solution. After drying and distilling the solvent, an epoxy compound was obtained. The aforementioned product was purified with silica gel chromatograph to obtain 129.8 g of transparent oil. The obtained epoxy compound was 1-allyl-3,5-bis (2-methyl-epoxy propyl) isocyanurate (Mw=309).

Synthesis Example 4

Preparation of 1-(2-methyl-propenyl)-3,5-diglycidyl isocyanurate

A reaction vessel equipped with a stirrer and a condenser was added with 400 ml of dimethylformamide as a solvent for reacting 157.5 g of sodium isocyanurate, 193.6 g of 3-bromo-1-propylene and 108 g of 3-bromo-2-methyl propene for 6 hours at 120 to 125° C., and then an inorganic salt was filtered off. Toluene was extracted out and the reactants were washed with water and dried and the solvent was dried to obtain 163.2 g of 1-(2-methyl-propenyl)-3,5-(3-propenyl) isocyanurate (Mw=263.3) as pale brown oil. 8700 ml of dichloromethane was taken as a solvent, and 163.2 g of 1-(2-methyl-propenyl)-3,5-(3-propenyl) isocyanurate and 535 g of m-chloroperbenzoic acid (not higher than 30° C.) was slowly added into a cooler and stirred at 25° C. for 4 hours. After completing the reaction, 3000 ml of 10% sodium bisulfite solution was slowly added at 20° C., and then an insoluble material was filtered off. Chloroform was added for extraction, and the reactants were washed thoroughly with 10% sodium bisulfite solution and saturated sodium bicarbonate solution. After drying and distilling the solvent, epoxy compound was obtained. The aforementioned product was purified by silica gel chromatograph to obtain 123.9 g of transparent oil. The obtained epoxy compound was 1-(2-methyl-propenyl)-3,5-diglycidyl isocyanurate (Mw=295).

Synthesis Example 5

Preparation of 1-(2-methyl-propenyl)-3,5-bis(2-methyl-epoxy propyl)isocyanurate

A reaction vessel equipped with a stirrer and a condenser was added with 400 ml of dimethylformamide as a solvent for reacting 157.5 g of sodium isocyanurate, 324 g of 3-bromo-2-methyl propene for 6 hours at 120 to 125° C., and then an inorganic salt was filtered off. Toluene was extracted out and the reactants were washed with water and dried and the solvent was dried to obtain 180.4 g of tris-2-methyl-propenyl isocyanurate (Mw=291) as pale brown oil. 8700 ml of dichloromethane was taken as a solvent, and 180.4 g of tris-2-methyl-propenyl isocyanurate and 535 g of m-chloroperbenzoic acid (not higher than 30° C.) was slowly added into a cooler and stirred and reacted at 25° C. for 4 hours. After completing the reaction, 3000 ml of 10% sodium bisulfite solution was slowly added at 20° C., and then an insoluble material was filtered off. Chloroform was added for extraction, and the reactants were washed thoroughly with 10% sodium bisulfite solution and saturated sodium bicarbonate solution. After drying and distilling the solvent to obtain an epoxy compound. The aforementioned product can be purified by silica gel chromatograph to obtain 135.7 g of transparent oil. The obtained epoxy compound was 1-(2-methyl-propenyl)-3,5-bis(2-methyl-epoxy propyl) isocyanurate (Mw=323).

Synthesis Example 6

Preparation of tris-(4,5-epoxypentyl)isocyanurate

A reaction vessel was added with 106 g of isocyanuric acid and 420 ml of water of slurry, and then 206 g of 48% sodium hydroxide solution was dropped into the aforementioned mixture. After the mixture was reacted for 2 hours at 60 to 70° C., water was removed, and the mixture was washed by methanol and then dried to obtain 157.5 g of sodium isocyanurate as white crystal. Then, the reaction vessel equipped with a stirrer and a condenser was added with 400 ml of dimethylformamide as a solvent for reacting 157.5 g of sodium isocyanurate and 361.4 g of 5-bromo-1-pentene for 6 hours at 120 to 125° C., and then an inorganic salt was filtered off. Toluene was extracted out and the reactants were washed with water and dried and the solvent was dried to obtain 205 g of tris-5-pentenyl isocyanurate as pale brown oil. 8700 ml of dichloromethane was taken as a solvent, and 205 g of tris-5-pentenyl isocyanurate (Mw=333) and 815 g of m-chloroperbenzoic acid (not higher than 30° C.) was slowly added into a cooler and stirred and reacted at 25° C. for 4 hours. After completing the reaction, 3000 ml of 10% sodium bisulfite solution was slowly added at 20° C., and then an insoluble material was filtered off. Chloroform was added for extraction, and the reactants were washed thoroughly with 10% sodium bisulfite solution and saturated sodium bicarbonate solution. After drying and distilling the solvent, an epoxy compound was obtained. The aforementioned product was purified by silica gel chromatograph to obtain 161.7 g of transparent oil. The obtained epoxy compound was tris-(4,5-epoxypentyl) isocyanurate represented by Formula (1-2) (Mw=381).

Synthesis Example B-1-1

A 500 mL four-necked flask was continuously added with 100 parts by weight of the compound prepared in Synthesis Example 1, 35 parts by weight of methacrylic acid, 0.3 parts by weight of benzyltriethylammonium chloride, 0.1 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a first compound (B-1-1) containing an ethylenically unsaturated group.

Synthesis Example B-1-2

A 500 mL four-necked flask was continuously added with 100 parts by weight of the compound prepared in Synthesis Example 2, 50 parts by weight of acrylic acid, 0.5 parts by weight of benzyltriethylammonium chloride, 0.2 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a first compound (B-1-2) containing an ethylenically unsaturated group.

Synthesis Example B-1-3

A 500 mL four-necked flask was continuously added with 100 parts by weight of the compound prepared in Synthesis Example 3, 55 parts by weight of methacrylic acid, 0.5 parts by weight of benzyltriethylammonium chloride, 0.2 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a first compound (B-1-3) containing an ethylenically unsaturated group.

Synthesis Example B-1-4

A 500 mL four-necked flask was added with 100 parts by weight of the compound prepared in Synthesis Example 4, 155 parts by weight of 2-methacryloyloxyethylbutanedioic acid (Mw=230), 0.3 parts by weight of methoxyphenol, 0.2 parts by weight of triphenyl phosphine, and 130 parts by weight of propylene glycol methyl ether acetate, wherein the temperature was maintained at 95° C., and the mixture was reacted for 9 hours to obtain a first compound (B-1-4) containing an ethylenically unsaturated group.

Synthesis Example B-1-5

A 500 mL four-necked flask was continuously added with 100 parts by weight of the compound prepared in Synthesis Example 5, 140 parts by weight of 2-methacryloyloxyethylbutanedioic acid (Mw=230), 0.4 parts by weight of benzyltriethylammonium chloride, 0.1 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a first compound (B-1-5) containing an ethylenically unsaturated group.

Synthesis Example B-1-6

A 500 mL four-necked flask was continuously added with 100 parts by weight of the compound prepared in Synthesis Example 6, 60 parts by weight of acrylic acid, 0.6 parts by weight of benzyltriethylammonium chloride, 0.2 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a first compound (B-1-6) containing an ethylenically unsaturated group.

Examples 1

100 parts by weight of the aforementioned first alkali-soluble resin synthesized by Synthesis Example A-1-1 (hereinafter as A-1-1), 3 parts by weight of the aforementioned B-1-1, 20 parts by weight of trispentaerythritol heptacrylate (hereafter as B-2-1), 7 parts by weight of EO-modified trimethylolpropyl triacrylate (hereafter as B-3-1), 5 parts by weight of 2-methyl-1-(4-methylthiophenyl)-2-morpholino-1-propanone (hereafter as C-1), 3 parts by weight of 2,2'-bis(2,4-dichlorophenyl)-4,4',5,5'-tetraphenyl-biimidazole (hereafter as C-2), 2 parts by weight of 4,4'-bis(diethyl-amino)benzophenone (hereafter as C-3), 40 parts by weight of the pigment (D-1, wherein the ratio of C.I. Pigment Red 254 and Pigment Yellow 139 was 80/20), 0.1 parts by weight of C.I. Direct Red 127 (hereafter as F-1) and 0.1 parts by weight of 3-mercaptopropyltrimethoxysilane (hereafter as G-1) were added into 500 parts by weight of propylene glycol monomethyl ether acetate (hereafter as E-1) and were mixed and dissolved using a shaker to obtain a photosensitive resin composition for a color filter. The obtained photosensitive resin composition for a color filter was subjected to assays shown below and the results are shown in Table 2.

Examples 2 to 10 and Comparative Examples 1 to 7

The preparations of Examples 2 to 10 and Comparative Examples 1 to 7 were similar to that of Example 1 with modifications of the kinds and amounts of the compositions. The compositions and the results of the assays were shown in Tables 2 and 3.

TABLE 2

| Components (parts by weight) | | | Example 1 | 2 | 3 | 4 | 5 | 6 | 7 | 8 | 9 | 10 |
|---|---|---|---|---|---|---|---|---|---|---|---|---|
| alkali-soluble resin (A) (parts by weight) | A-1 | A-1-1 | 100 | | | | | | | 3 | | |
| | | A-1-2 | | 100 | | | | | | | 30 | |
| | | A-1-3 | | | 100 | | | | | | | 60 |
| | A-2 | A-2-1 | | | | 100 | | | | 97 | | |
| | | A-2-2 | | | | | 100 | | | | 70 | |
| | | A-2-3 | | | | | | 100 | | | | 40 |
| | | A-2-4 | | | | | | | 100 | | | |
| compound (B) having an ethylenically unsaturated group (parts by weight) | B-1 | B-1-1 | 3 | | | | | | | 50 | | |
| | | B-1-2 | | 10 | | | | | | | 40 | |
| | | B-1-3 | | | 20 | | | | 30 | | | 60 |
| | | B-1-4 | | | | 30 | | | | | | |
| | | B-1-5 | | | | | 35 | | | | 20 | |
| | | B-1-6 | | | | | | 40 | | | | |
| | B-2 | B-2-1 | 20 | | | | | | 150 | | | |
| | | B-2-2 | | 40 | | | | | | 180 | | |
| | | B-2-3 | | | 60 | | | | | | 200 | |
| | B-3 | B-3-1 | 7 | | | 80 | | 120 | | | | 240 |
| | | B-3-2 | | | | | 100 | | 20 | | | |
| | B-4 | B-4-1 | | | | | | | | | | |
| | | B-4-2 | | | | | | | | | | |
| | | B-4-3 | | | | | | | | | | |
| photoinitiator (C) (parts by weight) | | C-1 | 5 | 10 | | 15 | 20 | | 30 | 25 | 45 | 45 |
| | | C-2 | 3 | 10 | 20 | 15 | 25 | 15 | 35 | | 40 | |
| | | C-3 | 2 | | | | | | 20 | 35 | | 35 |
| | | C-4 | | | 10 | 5 | | 20 | | 15 | | 20 |
| pigment (D) (parts by weight) | | D-1 | 40 | | | 150 | | | 250 | | | 400 |
| | | D-2 | | 60 | | | 180 | | | 300 | | |
| | | D-3 | | | 100 | | | 200 | | | 350 | |
| organic solvent (E) (parts by weight) | | E-1 | 500 | 1000 | 500 | | 1000 | 1000 | | 1000 | | 5000 |
| | | E-2 | | | | 1000 | 2000 | 1000 | 1500 | 3000 | 2500 | 4500 |
| dye (F) (parts by weight) | | F-1 | 0.1 | | | | | | | | | |
| | | F-2 | | | | | | 5 | | | | |
| | | F-3 | | | | | | | | | 10 | |
| additives (G) (parts by weight) | | G-1 | 0.1 | | | | | | | | | 10 |
| | | G-2 | | | | | | | 1 | | | |
| Evaluation | | Linearity of Pattern with high finesse | ○ | ◎ | ◎ | ◎ | ◎ | ◎ | ◎ | ○ | ◎ | ◎ |
| | | Developing-Resistance | ☆ | ☆ | ☆ | ○ | ○ | ○ | ◎ | ☆ | ☆ | ☆ |

TABLE 3

| Components (parts by weight) | | | Comparative example 1 | 2 | 3 | 4 | 5 | 6 | 7 |
|---|---|---|---|---|---|---|---|---|---|
| alkali-soluble resin (A) (parts by weight) | A-1 | A-1-1 | | | | | | | |
| | | A-1-2 | | | | | | | |
| | | A-1-3 | 100 | | | | | | |
| | A-2 | A-2-1 | | 100 | | | | | |
| | | A-2-2 | | | 100 | 100 | | | |
| | | A-2-3 | | | | | 100 | | 100 |
| | | A-2-4 | | | | | | 100 | |

TABLE 3-continued

| Components (parts by weight) | | | Comparative example | | | | | | |
|---|---|---|---|---|---|---|---|---|---|
| | | | 1 | 2 | 3 | 4 | 5 | 6 | 7 |
| compound (B) having an ethylenically unsaturated group (parts by weight) | B-1 | B-1-1 | | | | | | | |
| | | B-1-2 | | | | | | | |
| | | B-1-3 | | | | | | | |
| | | B-1-4 | | | | | | | |
| | | B-1-5 | | | | | | | |
| | | B-1-6 | | | | | | | |
| | B-2 | B-2-1 | | | | | | | |
| | | B-2-2 | | | | | | | |
| | | B-2-3 | | | 100 | | | | |
| | B-3 | B-3-1 | | 80 | | 60 | | 100 | |
| | | B-3-2 | 60 | | | | 80 | | 100 |
| | B-4 | B-4-1 | | | | 20 | | | |
| | | B-4-2 | | | | | 30 | | |
| | | B-4-3 | | | | | | 40 | |
| | | B-4-4 | | | | | | | 40 |
| photoinitiator (C) (parts by weight) | | C-1 | | 15 | | | 15 | 20 | 20 |
| | | C-2 | 20 | 15 | 15 | 20 | 15 | 25 | 20 |
| | | C-3 | | | 10 | | | | |
| | | C-4 | 10 | 5 | 20 | 10 | 5 | | 5 |
| pigment (D) (parts by weight) | | D-1 | 100 | | | | | 200 | |
| | | D-2 | | 150 | | | 150 | | 200 |
| | | D-3 | | | 200 | 100 | | | |
| organic solvent (E) (parts by weight) | | E-1 | 1500 | | | 1500 | 1000 | 2500 | |
| | | E-2 | | 2000 | 2500 | | 1000 | | 2500 |
| dye (F) (parts by weight) | | F-1 | | | | | | | |
| | | F-2 | | | | | | | |
| | | F-3 | | | | | | | |
| additives (G) (parts by weight) | | G-1 | | | | | | | |
| | | G-2 | | | | | | | |
| Evaluation | | Linearity of Pattern with high finesse | X | X | X | X | X | X | X |
| | | Developing-Resistance | ○ | Δ | ○ | Δ | Δ | Δ | Δ |

In Table 2 and Table 3
B-2-1 trispentaerythritol heptacrylate
B-2-2 tetrapentaerythritol nonaacrylate
B-2-3 tetrapentaerythritol decaacrylate
B-3-1 EO-modified trimethylolpropyl triacrylate
B-3-2 caprolactone-modified dipentaerythritol hexaacrylate
B-4-1 tri-5-5-isopentenyl
B-4-2 diallylmonoglycidyl isocyanurate
B-4-3 monoallyldiglycidyl isocyanurate
B-4-4 tris(2-acryloxyethyl) isocyanulate
C-1 2-methyl-1-(4-methylthiophenyl)-2-morpholino-1-propanone
C-2 2,2'-bis(2,4-dichlorophenyl)-4,4',5,5'-tetraphenyl-bi-imidazole
C-3 4,4'-bis(diethylamino)benzophenone
C-4 1-(4-phenyl-thio-phenyl)-octane-1,2-dion-2-oxime-O-benzoate
D-1 C.I. Pigment Red 254/C.I. Pigment Yellow 139=80/20
D-2 C.I. Pigment Green 36/C.I. Pigment Yellow 150=60/40
D-3 C.I. Pigment Blue 15:6
E-1 ethyl 3-ethoxypropionate
E-2 propylene glycol monomethyl ether acetate
F-1 C.I. Direct Red 127
F-2 C.I. Acid Green 5
F-3 C.I. Acid Red 289
G-1 3-mercaptopropyltrimethoxysilane
G-2 2,2-thiobis(4-methyl-6-t-butylphenol)

Evaluation Items

Linearity of Pattern with High Finesse

The photosensitive resin composition of the examples and the comparative examples was coated on a glass substrate with a length and width of 100 mm and dried at a pressure of 100 mmHg for 30 seconds. Then, the aforementioned glass substrate was pre-baked at 80° C. for 3 minutes to form a pre-baked coating film having a film thickness of 2.5 μm. The pre-baked coating film was exposed with a mask having a 25 μm (pitch 50 μm) stripe pattern and by ultraviolet light (exposure machine model: PLA-501F; manufactured by Canon) at an energy density of 300 mJ/cm². Then, the pre-baked coating film was immersed in a developing solution at 23° C. for 2 minutes. After washing with pure water, the pre-baked coating film was post baked in an oven at 200° C. for 80 minutes. A photosensitive resin layer of 2.0 μm film thickness was thus formed on the glass substrate.

A stripe pattern formed by the aforementioned method was observed and evaluated by using an optical microscope. The criteria are shown below:

⊚: good linearity of pattern with high finesse above 95%
○: good linearity of pattern with high finesse above 90% but below 95%
Δ: good linearity of pattern with high finesse above 80% but below 90%
X: good linearity of pattern with high finesse below 80%

Developing-Resistance

The solution state photosensitive resin composition for the color filter was coated on a 100 mm×100 mm glass substrate using a rotation coating method, and decompression drying was first carried out at a pressure of 100 mmHg for 30 seconds. After pre-baking at a temperature of 80° C. for 2 minutes, a pre-baked coating film of 2.5 μm film thickness was formed. Then, the chromaticity (L*, a*, b*) was measured with the chromometer (Otsuka Electronics Co., Ltd., Model MCPD).

The aforementioned coating film was radiated with UV ray of 100 mJ/cm² (Canon PLA-501F) and immersed in the developer at 23° C. for 1 minute. Then, the film was washed with deionized water. The chromaticity was measured again. If the resulting change in chromaticity (ΔEab*) is smaller, the developing-resistance is better. The difference of the chromaticity (ΔEab*) was measured by Formula (I) as below:

$$\Delta Eab^* = \{(\Delta L)^2 + (\Delta a)^2 + (\Delta b)^2\}^{1/2} \quad \text{Formula (I)}$$

☆: ΔEab*<1○
◎: 1≤ΔEab*<2○
○: 2≤ΔEab*<4○
Δ: 4≤ΔEab*<6○
X: 6≤ΔEab*○

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:
1. A photosensitive resin composition for a color filter comprising:
   an alkali-soluble resin (A);
   a compound (B) containing an ethylenically unsaturated group;
   a photoinitiator (C);
   a pigment (D); and
   an organic solvent (E);
   wherein: the compound (B) containing the ethylenically unsaturated group comprises a first compound (B-1) having an ethylenically unsaturated group obtained by reacting a mixture, and the mixture comprises an epoxy compound (b-1-1) represented by Formula (1) and a compound (b-1-2) having at least one carboxylic acid group and at least one ethylenically unsaturated group;

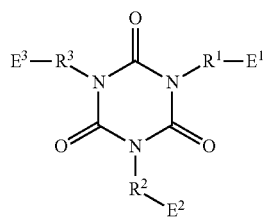

Formula (1)

in Formula (1):
$R^1$, $R^2$ and $R^3$ independently represent a branched or linear $C_1$-$C_6$ alkylene group or a branched or linear $C_1$-$C_6$ oxyalkylene group;
$E^1$, $E^2$ and $E^3$ independently represent an epoxy-containing group represented by Formula (2), an organic group represented by Formula (3) or a hydrogen atom, wherein at least one of $E^1$, $E^2$ and $E^3$ represents the epoxy-containing group represented by Formula (2); and

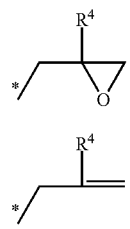

Formula (3)

in Formulae (2) and (3), $R^4$ represents a hydrogen atom or a methyl group,
wherein the compound (B) containing the ethylenically unsaturated group comprises a second compound (B-2) having an ethylenically unsaturated group represented by Formula (4);

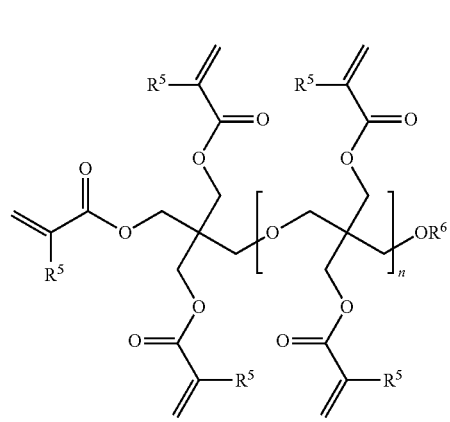

Formula (4)

in Formula (4):
$R^5$ represents a hydrogen atom or a methyl group;
$R^6$ represents a hydrogen atom, an acryloyl group or a methyl acryloyl group; and
n represents an integer of 2 to 3.
2. The photosensitive resin composition for the color filter according to claim 1, wherein $R^1$, $R^2$ and $R^3$ represent a $C_1$-$C_3$ alkylene group.
3. The photosensitive resin composition for the color filter according to claim 1, wherein at least two of $E^1$, $E^2$ and $E^3$ represent the epoxy-containing group represented by Formula (2).
4. The photosensitive resin composition for the color filter according to claim 1, wherein based on 100 parts by weight of a used amount of the alkali-soluble resin (A), a used amount of the first compound (B-1) having the ethylenically unsaturated group is from 3 parts by weight to 60 parts by weight.
5. The photosensitive resin composition for the color filter according to claim 1, wherein based on 100 parts by weight of a used amount of the alkali-soluble resin (A), a used amount of the second compound (B-2) having the ethylenically unsaturated group is from 20 parts by weight to 200 parts by weight.
6. The photosensitive resin composition for the color filter according to claim 1, wherein the alkali-soluble resin (A) comprises a first alkali-soluble resin (A-1) obtained by reacting a first mixture, and the first mixture comprises an epoxy compound (a-1) having at least two epoxy groups and a compound (a-2) having at least one carboxylic acid group and at least one ethylenically unsaturated group.

7. The photosensitive resin composition for the color filter according to claim 6, wherein the epoxy compound (a-1) having at least two epoxy groups contains a compound represented by Formula (5), a compound represented by Formula (6) or combinations thereof;

Formula (5)

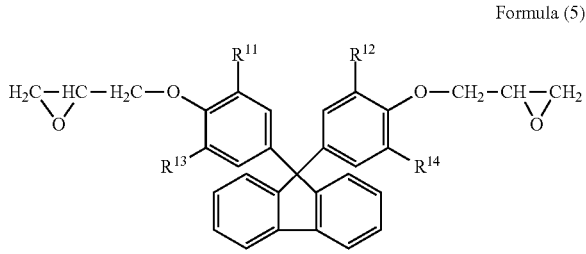

in Formula (5), $R^{11}$, $R^{12}$, $R^{13}$ and $R^{14}$ independently represent a hydrogen atom, a halogen atom, a $C_1$-$C_5$ alkyl group, a $C_1$-$C_5$ alkoxy group, a $C_6$-$C_{12}$ aryl group or a $C_6$-$C_{12}$ aralkyl group;

Formula (6)

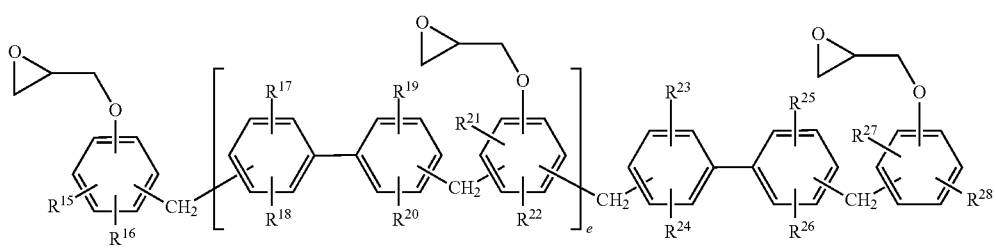

in Formula (6), $R^{15}$ to $R^{28}$ independently represent a hydrogen atom, a halogen atom, a $C_1$-$C_8$ alkyl group, or a $C_6$-$C_{15}$ aromatic group; and e represents an integer from 0 to 10.

8. The photosensitive resin composition for the color filter according to claim 6, wherein based on 100 parts by weight of a used amount of the alkali-soluble resin (A), a used amount of the first alkali-soluble resin (A-1) is from 3 parts by weight to 100 parts by weight.

9. The photosensitive resin composition for the color filter according to claim 1, wherein based on 100 parts by weight of a used amount of the alkali-soluble resin (A), a used amount of the compound (B) containing the ethylenically unsaturated group is from 30 parts by weight to 300 parts by weight; a used amount of the photoinitiator (C) is from 10 parts by weight to 100 parts by weight; a used amount of the pigment (D) is from 40 parts by weight to 400 parts by weight; and a used amount of the organic solvent (E) is from 500 parts by weight to 5000 parts by weight.

10. A method for manufacturing a color filter comprising forming a pixel layer with the photosensitive resin composition according to claim 1.

11. The method according to claim 10, wherein $R^1$, $R^2$ and $R^3$ represent a $C_1$-$C_3$ alkylene group.

12. The method according to claim 10, wherein at least two of $E^1$, $E^2$ and $E^3$ represent the epoxy-containing group represented by Formula (2).

13. The method according to claim 10, wherein based on 100 parts by weight of a used amount of the alkali-soluble resin (A), a used amount of the first compound (B-1) having the ethylenically unsaturated group is from 3 parts by weight to 60 parts by weight.

14. The method according to claim 10, wherein based on 100 parts by weight of a used amount of the alkali-soluble resin (A), a used amount of the second compound (B-2) having the ethylenically unsaturated group is from 20 parts by weight to 200 parts by weight.

15. The method according to claim 10, wherein the alkali-soluble resin (A) comprises a first alkali-soluble resin (A-1) obtained by reacting a first mixture, and the first mixture comprises an epoxy compound (a-1) having at least two epoxy groups and a compound (a-2) having at least one carboxylic acid group and at least one ethylenically unsaturated group.

16. The method according to claim 15, wherein the epoxy compound (a-1) having at least two epoxy groups contains a compound represented by Formula (5), a compound represented by Formula (6) or combinations thereof;

Formula (5)

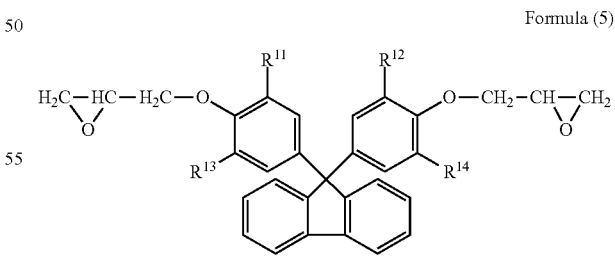

in Formula (5), $R^{11}$, $R^{12}$, $R^{13}$ and $R^{14}$ independently represent a hydrogen atom, a halogen atom, a $C_1$-$C_5$ alkyl group, a $C_1$-$C_5$ alkoxy group, a $C_6$-$C_{12}$ aryl group or a $C_6$-$C_{12}$ aralkyl group;

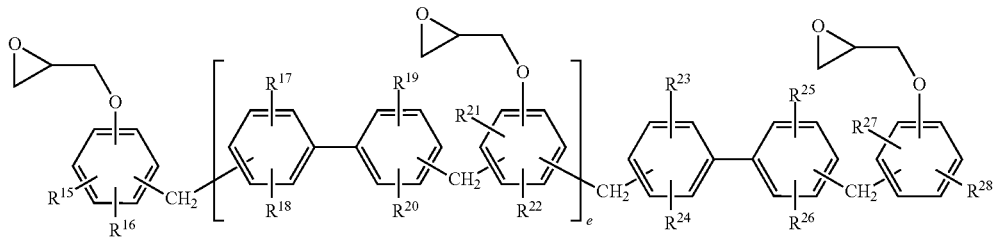

Formula (6)

in Formula (6), $R^{15}$ to $R^{28}$ independently represent a hydrogen atom, a halogen atom, a $C_1$-$C_8$ alkyl group, or a $C_6$-$C_{15}$ aromatic group; and e represents an integer from 0 to 10.

17. The method according to claim 15, wherein based on 100 parts by weight of a used amount of the alkali-soluble resin (A), a used amount of the first alkali-soluble resin (A-1) is from 3 parts by weight to 100 parts by weight.

18. The method according to claim 10, wherein based on 100 parts by weight of a used amount of the alkali-soluble resin (A), a used amount of the compound (B) containing the ethylenically unsaturated group is from 30 parts by weight to 300 parts by weight; a used amount of the photoinitiator (C) is from 10 parts by weight to 100 parts by weight; a used amount of the pigment (D) is from 40 parts by weight to 400 parts by weight; and a used amount of the organic solvent (E) is from 500 parts by weight to 5000 parts by weight.

19. A color filter manufactured by the method according to claim 10.

20. A liquid crystal display device comprising the color filter according to claim 19.

* * * * *